United States Patent
Kim et al.

(10) Patent No.: US 12,402,502 B2
(45) Date of Patent: Aug. 26, 2025

(54) PERIPHERAL ESD CIRCUIT FOR A FLEXIBLE DISPLAY

(71) Applicant: Samsung Display Co., Ltd., Yongin-si (KR)

(72) Inventors: Sunkwang Kim, Yongin-si (KR); Donghyeon Ki, Yongin-si (KR); Hyungjin Song, Yongin-si (KR); Dongyoon Lee, Yongin-si (KR); Seongyoung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 413 days.

(21) Appl. No.: 17/967,757

(22) Filed: Oct. 17, 2022

(65) Prior Publication Data

US 2023/0255075 A1   Aug. 10, 2023

(30) Foreign Application Priority Data

Feb. 8, 2022   (KR) .................. 10-2022-0016425

(51) Int. Cl.
*H10K 59/131* (2023.01)
*H10K 59/12* (2023.01)
*H10K 71/00* (2023.01)

(52) U.S. Cl.
CPC ......... *H10K 59/1315* (2023.02); *H10K 71/00* (2023.02); *H10K 59/1201* (2023.02)

(58) Field of Classification Search
CPC .............. H10K 59/1315; H10K 71/00; H10K 59/1201; H10K 50/19; H10K 59/38; H10K 59/1216; H10K 59/131; H10K 59/1213; H10K 50/81; H10K 50/82; H10K 59/32; G09G 3/3233; G09G 2300/0426;
(Continued)

(56) References Cited

U.S. PATENT DOCUMENTS 7,342,617 B2   3/2008   Tanaka et al.
9,153,192 B2   10/2015  Jung et al.
(Continued)

FOREIGN PATENT DOCUMENTS

KR   10-0692434 B1   3/2007
KR   10-0965583 B1   6/2010
(Continued)

*Primary Examiner* — J. E. Schoenholtz
(74) *Attorney, Agent, or Firm* — Womble Bond Dickinson (US) LLP

(57) ABSTRACT

A display apparatus includes a substrate including a data line extending in a first direction, a voltage line extending in the first direction, and a first circuit disposed in a non-display area and electrically connected to the data line and the voltage line, wherein the first circuit includes a thin-film transistor including a semiconductor layer and a gate electrode overlapping a semiconductor layer, where one side of the semiconductor layer is electrically connected to the data line and another side is electrically connected to the voltage line, a first capacitor including a first lower electrode not overlapping the semiconductor layer and a first upper electrode on the first lower electrode, and a second capacitor including a second lower electrode not overlapping the semiconductor layer and a second upper electrode on the second lower electrode, and the gate electrode is at a same layer as the data line and the voltage line.

20 Claims, 34 Drawing Sheets

(58) Field of Classification Search
CPC .. G09G 2330/04; H10D 86/481; H10D 86/60; H10D 86/441; H10H 29/142
See application file for complete search history.

(56) References Cited

U.S. PATENT DOCUMENTS

| | | | |
|---|---|---|---|
| 10,622,069 B2 | 4/2020 | Widjaja | |
| 2019/0067409 A1* | 2/2019 | Shin | H10D 89/811 |
| 2023/0071094 A1* | 3/2023 | Son | H10D 86/441 |
| 2023/0209930 A1* | 6/2023 | Jang | H10K 50/844 |
| | | | 257/40 |

FOREIGN PATENT DOCUMENTS

| | | |
|---|---|---|
| KR | 10-2014-0087341 A | 7/2014 |
| KR | 10-2016-0082738 A | 7/2016 |

* cited by examiner

PERIPHERAL ESD CIRCUIT FOR A FLEXIBLE DISPLAY

CROSS-REFERENCE TO RELATED APPLICATION

This application claims priority to and the benefit of Korean Patent Application No. 10-2022-0016425, filed on Feb. 8, 2022, in the Korean Intellectual Property Office, the entire disclosure of which is incorporated by reference herein.

BACKGROUND

1. Field

Aspects of one or more embodiments relate to a display apparatus for coping with electrostatic electricity.

2. Description of the Related Art

Display apparatuses are apparatuses that visually display data. Display apparatuses may be used as displays for small-sized products, such as cellular phones, or displays for large-sized products, such as televisions.

Display apparatuses may include liquid-crystal display apparatuses that do not directly emit light but use light of backlight devices or include light-emitting display apparatuses including display elements that may emit light, wherein the display elements may include emission layers.

SUMMARY

One or more embodiments of the present disclosure provide a display apparatus having a simple stack structure and in which electrostatic electricity is prevented (or substantially prevented). However, this objective is an example and does not limit the scope of the disclosure.

Additional aspects will be set forth in part in the description that follows and, in part, will be apparent from the description or may be learned by practice of the embodiments of the present disclosure.

According to one or more embodiments, a display apparatus includes a substrate including a display area and a non-display area outside the display area, a data line in the display area and extending in a first direction, a voltage line in the display area and extending in the first direction, and a first circuit disposed in the non-display area and electrically connected to the data line and the voltage line, wherein the first circuit includes a thin-film transistor including a semiconductor layer and a gate electrode overlapping a semiconductor layer, wherein the semiconductor layer is in the non-display area, and one side of the semiconductor layer is electrically connected to the data line and the other side of the semiconductor layer is electrically connected to the voltage line, a first capacitor electrically connected to the data line and the gate electrode and including a first lower electrode not overlapping the semiconductor layer and a first upper electrode on the first lower electrode, and a second capacitor electrically connected to the voltage line and the gate electrode and including a second lower electrode not overlapping the semiconductor layer and a second upper electrode on the second lower electrode, and the gate electrode is on a same layer as the data line and the voltage line.

In one or more embodiments, each of the first upper electrode and the second upper electrode may be integrated with the gate electrode.

In one or more embodiments, the voltage line may include a driving voltage line.

In one or more embodiments, the semiconductor layer may include a channel area overlapping the gate electrode, a first low-resistance area and a second low-resistance area, where the first low-resistance area may be at one side of the channel area and the second low-resistance area may be at another side of the channel area.

In one or more embodiments, each of the first lower electrode and the second lower electrode may be at a same layer as the semiconductor layer.

In one or more embodiments, each of the first lower electrode and the second lower electrode may have a higher carrier concentration than the channel area.

In one or more embodiments, each of the first lower electrode and the second lower electrode may be a part of a first conductive pattern arranged between the substrate and the semiconductor layer and insulated from the semiconductor layer.

In one or more embodiments, the first capacitor and the second capacitor may be configured to allow current to flow through the channel area, when alternating static electricity occurs in the data line.

In one or more embodiments, the semiconductor layer may include an oxide semiconductor material.

In one or more embodiments, the semiconductor layer may have a curved shape in a plan view.

According to one or more embodiments, a display apparatus includes a substrate including a display area and a non-display area outside the display area, a data line in the display area and extending in a first direction, a voltage line in the display area and extending in the first direction, and a first circuit disposed in the non-display area and electrically connected to the data line and the voltage line, wherein the first circuit includes a semiconductor layer located between a portion of the data line and a portion of the voltage line, the portion of the data line and the portion of the voltage line extending to the non-display area, and electrically connected to each of the portion of the data line and the portion of the voltage line, a first capacitor including a first lower electrode electrically connected to the data line, a second capacitor including a second lower electrode electrically connected to the voltage line, and a conductor overlapping a portion of the semiconductor layer, at least a portion of the first lower electrode, and at least a portion of the second lower electrode.

In one or more embodiments, the conductor may be at a same layer as the data line and the voltage line.

In one or more embodiments, the voltage line may include a driving voltage line.

In one or more embodiments, the semiconductor layer may include a channel area overlapping the conductor and a first low-resistance area and a second low-resistance area at both sides of the channel area, respectively.

In one or more embodiments, each of the first lower electrode and the second lower electrode may be at a same layer as the semiconductor layer.

In one or more embodiments, each of the first lower electrode and the second lower electrode may have a higher carrier concentration than the channel area.

In one or more embodiments, each of the first lower electrode and the second lower electrode may be a part of a first conductive pattern arranged between the substrate and the semiconductor layer and insulated from the semiconductor layer.

In one or more embodiments, the first capacitor and the second capacitor may be configured to allow current to flow through the channel area, when alternating static electricity occurs in the data line.

In one or more embodiments, the semiconductor layer may include an oxide semiconductor material.

In one or more embodiments, the semiconductor layer may have a curved shape in a plan view.

BRIEF DESCRIPTION OF THE DRAWINGS

The above and other aspects, features, and/or principles of the embodiments of the present disclosure will be more apparent from the following description taken in conjunction with the accompanying drawings, in which.

DETAILED DESCRIPTION

Figure 1A:
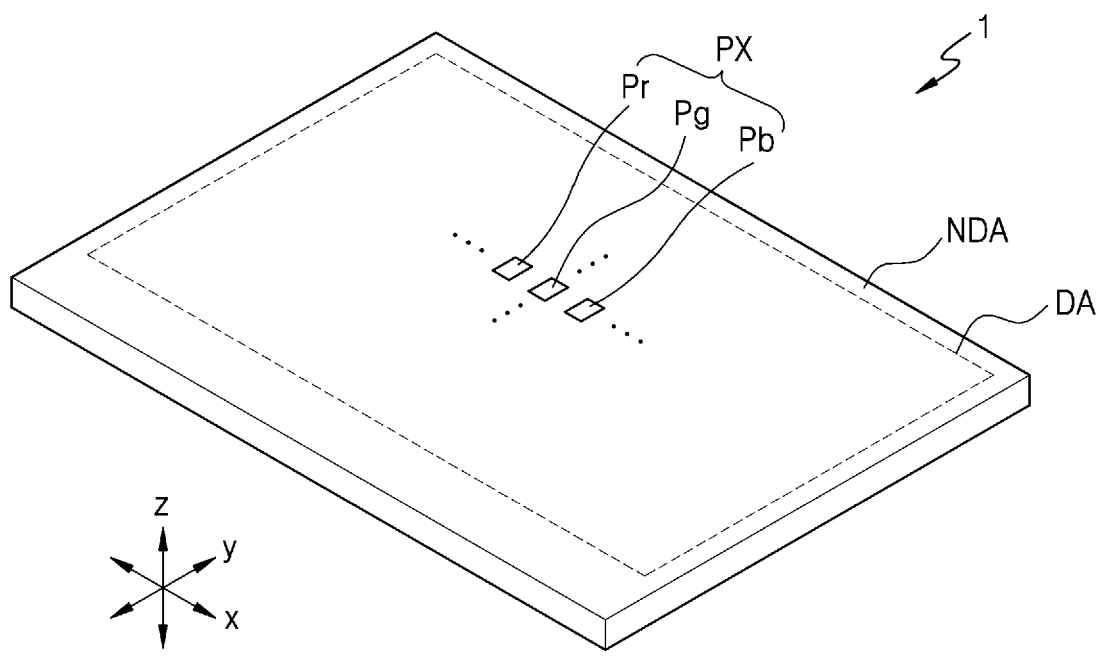
FIG. 1A is a schematic perspective view of a display apparatus according to one or more embodiments of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

It will be understood that although the terms "first," "second," etc. may be used herein to describe various components, these components should not be limited by these terms. These components are only used to distinguish one component from another.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the singular expressions "a," "an," and "the" are intended to include the plural forms as well, unless the context clearly indicates otherwise.

It will be further understood that the terms "comprises," "comprising," "includes," and/or "including" used herein specify the presence of stated features or components, but do not preclude the presence or addition of one or more other features or components.

It will be understood that when a layer, region, or element is referred to as being "on" and/or "connected to" another layer, area, or element, it can be directly or indirectly on and/or connected to the other layer, region, or element. That is, for example, intervening layers, regions, or elements may be present. In addition, it will also be understood that when an element or layer is referred to as being "between" two elements or layers, it can be the only element or layer between the two elements or layers, or one or more intervening elements or layers may also be present.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

In this specification, the expression "A and/or B" may indicate A, B, or A and B. Also, in this specification, the expression "at least one of A and B" may indicate A, B, or A and B.

In embodiments described hereinafter, "lines extending in a first direction or a second direction" denotes not only the lines extending as a linear shape, but also the lines extending in the first direction or the second direction as a zig-zag shape or a circular shape.

In the embodiments hereinafter, the expression "planar" indicates a shape when an object is seen downwardly, and the expression "cross-sectional" indicates a shape when an object, which is vertically taken, is seen from the lateral perspective. In the embodiments below, when a part is referred to as "overlapping," the part may be "planarly" or "cross-sectionally" overlapping.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the disclosure will be described in detail with reference to the accompanying drawings. Also, when the descriptions are given by referring to the drawings, the same elements or the corresponding elements will be referred to by using the same reference numerals unless otherwise noted.

FIG. 1A is a schematic perspective view of a display apparatus 1 according to one or more embodiments of the present disclosure.

Referring to FIG. 1A, the display apparatus 1 may include a display area DA and a non-display area NDA outside the display area DA. The display apparatus 1 may provide an image through an array of a plurality of sub-pixels PX that are two-dimensionally arranged on (or at) an x-y plane in the display area DA. Each sub-pixel PX may emit a different color of light, and may include, for example, one of a red sub-pixel Pr, a green sub-pixel Pg, and/or a blue sub-pixel Pb.

According to one or more embodiments, the plurality of sub-pixels PX may include a first sub-pixel, a second sub-pixel, and a third sub-pixel, and hereinafter, for convenience of explanation, descriptions are given based on a case where the first sub-pixel is a red sub-pixel Pr, the second sub-pixel is a green sub-pixel Pg, and the third sub-pixel is a blue sub-pixel Pb.

The red sub-pixel Pr, the green sub-pixel Pg, and the blue sub-pixel Pb may be areas for emitting red light, green light, and blue light, respectively, and the display apparatus 1 may provide an image by using the light emitted from the sub-pixels PX.

The non-display area NDA is an area that may not provide an image, and the non-display area NDA may entirely surround (or may be around) the display area DA in a plan view. Drivers or main voltage lines configured to provide electrical signals or power to sub-pixel circuits may be arranged in the non-display area NDA. The non-display area NDA may include a pad, which is an area, to which an electronic device or a printed circuit board may be electrically connected.

The display area DA may have a polygonal shape including a quadrangular shape, as illustrated in FIG. 1A. For example, the display area DA may have a rectangular shape having a horizontal length that is greater than a vertical length, a rectangular shape having a horizontal length that is less than a vertical length, or a square shape. According to one or more embodiments, the display area DA may have various shapes, for example, an oval shape or a circular shape. Also, although FIG. 1A illustrates that the display apparatus 1 is a flat display apparatus, the display apparatus 1 may be realized in various forms, such as a flexible display apparatus, a foldable display apparatus, and/or a rollable display apparatus.

According to one or more embodiments, the display apparatus 1 may include an organic light-emitting display apparatus. According to one or more embodiments, the display apparatus 1 may include an inorganic light-emitting display apparatus and/or a quantum-dot light-emitting display apparatus. For example, an emission layer of a display element included in the display apparatus 1 may include an organic material, an inorganic material, quantum dots, an organic material and quantum dots, an inorganic material and quantum dots, or an organic material, an inorganic material, and quantum dots. Hereinafter, for convenience of explanation, embodiments in which the display apparatus 1 is an organic light-emitting display apparatus are mainly described in detail.

Figure 1B:
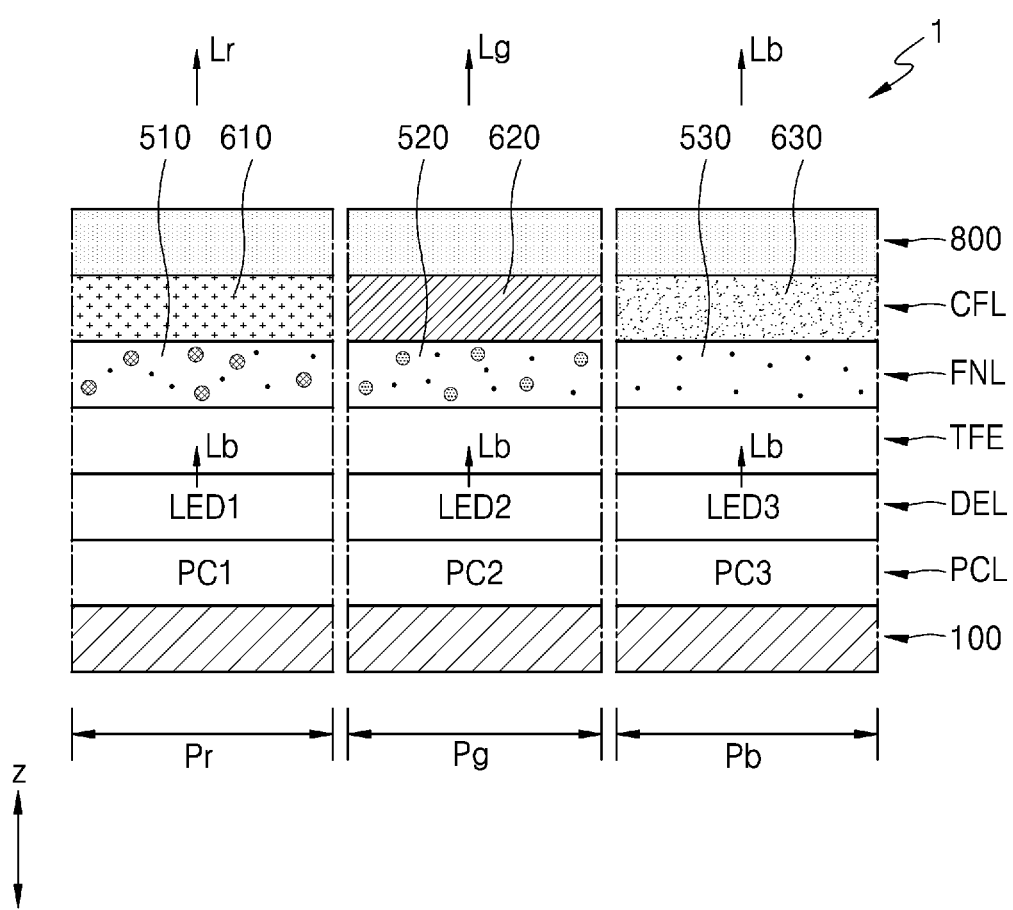
FIG. 1B is a schematic cross-sectional view of sub-pixels of a display apparatus according to one or more embodiments of the present disclosure.

FIG. 1B is a schematic cross-sectional view of sub-pixels PX of the display apparatus 1 according to one or more embodiments of the present disclosure.

Referring to FIG. 1B, the display apparatus 1 may include a circuit layer PCL on a substrate 100. The circuit layer PCL may include a first sub-pixel circuit PC1, a second sub-pixel circuit PC2, a third sub-pixel circuit PC3, and insulating layers, and each of the first through third sub-pixel circuits PC1 through PC3 may include a thin-film transistor and/or a capacitor. A display element layer DEL may include a first light-emitting diode LED1, a second light-emitting diode LED2, and a third light-emitting diode LED3, as display elements. The first through third sub-pixel circuits PC1 through PC3 may be electrically connected to the first through third light-emitting diodes LED1 through LED3 of the display element layer DEL, respectively.

The first through third light-emitting diodes LED1 through LED3 may include organic light-emitting diodes including organic materials. According to one or more embodiments, the first through third light-emitting diodes LED1 through LED3 may include inorganic light-emitting diodes including inorganic materials. An inorganic light-emitting diode may include a PN junction diode including inorganic semiconductor-based materials. When a voltage is applied to the PN junction diode in a normal (or perpendicular) direction, holes and electrons may inject into the PN junction diode, and energy generated by recombination of the holes and the electrons may convert into light energy to emit a certain color of light. The inorganic light-emitting diode described above may have a width that is several to hundreds of micrometers or several to hundreds of nanometers. In one or more embodiments, the first through third light-emitting diodes LED1 through LED3 may respectively include light-emitting diodes including quantum dots. As described above, emission layers of the first through third light-emitting diodes LED1 through LED3 may include organic materials, inorganic materials, quantum dots, organic materials and quantum dots, or inorganic materials and quantum dots.

The first through third light-emitting diodes LED1 through LED3 may emit the same color of light. For example, the first through third light-emitting diodes LED1 through LED3 may emit blue light Lb. However, the present disclosure is not limited thereto. According to one or more embodiments, the first through third light-emitting diodes LED1 through LED3 may emit different colors of light from one another. The light (for example, blue light Lb) emitted from the first through third light-emitting diodes LED1 through LED3 may pass through an encapsulation layer TFE on the display element layer DEL and may be transmitted through a color-conversion-transmission layer FNL.

The color-conversion-transmission layer FNL may include optical portions configured to transmit the light (for example, the blue light Lb) emitted from the display element layer DEL by converting or not converting the color of light. For example, the color-conversion-transmission layer FNL may include color-conversion portions configured to convert the light (for example, the blue light Lb) emitted from the display element layer DEL into another color of light and a transmission portion configured to transmit the light (for example, the blue light Lb) emitted from the display element layer DEL without converting the color of light. The color-conversion-transmission layer FNL may include a first color-conversion portion 510 corresponding to the red sub-pixel Pr, a second color-conversion portion 520 corresponding to the green sub-pixel Pg, and a transmission portion 530 corresponding to the blue sub-pixel Pb. The first color-conversion portion 510 may convert the blue light Lb into red light Lr, and the second color-conversion portion 520 may convert the blue light Lb into green light Lg. The transmission portion 530 may transmit the blue light Lb without converting the color of light.

A color layer CFL may be arranged on (or at) the color-conversion-transmission layer FNL. The color layer CFL may include a first color filter 610, a second color filter 620, and a third color filter 630 that have different colors from one another. For example, the first color filter 610 may be a red color filter, the second color filter 620 may be a green color filter, and the third color filter 630 may be a blue color filter.

The light having the color converted by the color-conversion transmission layer FNL and the light transmitted by the color-conversion transmission layer FNL may have an improved color purity by passing through the first through third color filters 610 through 630. Also, the color layer CFL may prevent or minimize the phenomenon that external light (for example, light that is incident on the display apparatus 1 from the outside of the display apparatus 1) is reflected and viewed by a user.

A transmissive substrate layer 800 may be provided on the color layer CFL. The transmissive substrate layer 800 may include glass or a transmissive organic material. For example, the transmissive substrate layer 800 may include a transmissive organic material, such as an acryl-based resin.

According to one or more embodiments, the transmissive substrate layer 800 may be a type of substrate, and after the color layer CFL and the color-conversion-transmission layer FNL are formed on (or at) the transmissive substrate layer 800, the transmissive substrate layer 800 may be integrated with the encapsulation layer TFE such that the color-conversion-transmission layer FNL may face the encapsulation layer TFE.

According to one or more embodiments, after the color-conversion-transmission layer FNL and the color layer CFL are sequentially formed on (or at) the encapsulation layer TFE, the transmissive substrate layer 800 may be directly coated and cured on the color layer CFL. In one or more embodiments, another optical film, for example, an anti-reflection (AR) film or other suitable optical film, may be arranged on (or at) the transmissive substrate layer 800.

The display apparatus 1 having the structure described above may include an electronic device capable of displaying a video and/or a still image, such as a television, a billboard, a movie theater screen, a monitor, a tablet personal computer (PC), a notebook computer, or another suitable device.

Figure 1C:
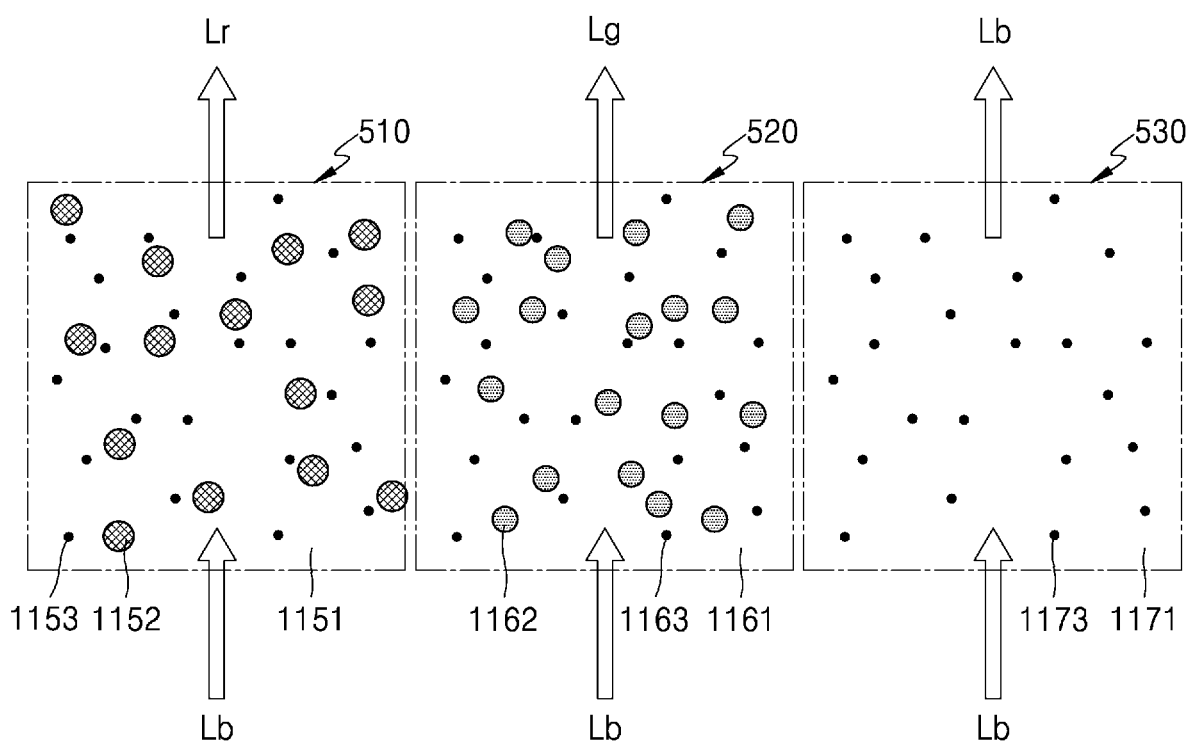
FIG. 1C illustrates optical portions of a color-conversion-transmission layer of FIG. 1B according to one or more embodiments of the present disclosure.

FIG. 1C illustrates the optical portions of the color-conversion-transmission layer FNL of FIG. 1B according to one or more embodiments of the present disclosure.

Referring to FIG. 1C, the first color-conversion portion 510 may convert incident blue light Lb into red light Lr. As illustrated in FIG. 1C, the first color-conversion portion 510 may include a first photo-sensitive polymer 1151, first quantum dots 1152 and first scattering particles 1153, wherein the first quantum dots 1152 and the first scattering particles 1153 are distributed in the first photo-sensitive polymer 1151.

The first quantum dots 1152 may be excited by the blue light Lb and may emit red light Lr having a greater wavelength than the blue light Lb in an isotropic fashion. The first photo-sensitive polymer 1151 may include a light-transmissive organic material.

The first scattering particles 1153 may scatter the blue light Lb not absorbed by the first quantum dots 1152 to excite more first quantum dots 1152, thereby improving color-conversion efficiency. The first scattering particles 1153 may include, for example, oxide titanium $TiO_2$ and/or metal particles. The first quantum dots 1152 may be selected from a Groups II-VI compound, a Groups III-V compound, a Groups IV-VI compound, a Group IV element, a Group IV compound, and/or a combination thereof.

The second color-conversion portion 520 may convert the incident blue light Lb into green light Lg. As illustrated in FIG. 1C, the second color-conversion portion 520 may include a second photo-sensitive polymer 1161, second quantum dots 1162 and second scattering particles 1163, wherein the second quantum dots 1162 and the second scattering particles 1163 are distributed in the second photo-sensitive polymer 1161.

The second quantum dots 1162 may be excited by the blue light Lb and may emit green light Lg having a greater wavelength than the blue light Lb in an isotropic fashion. The second photo-sensitive polymer 1161 may include a light-transmissive organic material.

The second scattering particles 1163 may scatter the blue light Lb not absorbed by the second quantum dots 1162 to excite more second quantum dots 1162, thereby increasing color-conversion efficiency. The second scattering particles 1163 may include, for example, $TiO_2$ and/or metal particles. The second quantum dots 1162 may be selected from a Groups II-VI compound, a Groups III-V compound, a Groups IV-VI compound, a Group IV element, a Group IV compound, and/or a combination thereof.

The transmission portion 530 may transmit the blue light Lb that is incident into the transmission portion 530 without converting the color. As illustrated in FIG. 1C, the transmission portion 530 may include a third photo-sensitive polymer 1171 in which third scattering particles 1173 are distributed. The third photo-sensitive polymer 1171 may include a light-transmissive organic material, such as a silicon resin, an epoxy resin, and/or other suitable material(s), and may include the same material as the first and/or second photo-sensitive polymers 1151 and 1161. The third scattering particles 1173 may scatter and emit the blue light Lb and may include the same material as the first and/or second scattering particles 1153 and 1163.

Figure 2A:
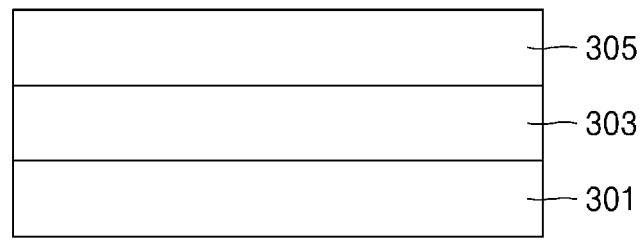
FIGS. 2A through 2E are cross-sectional views of structures of display elements according to one or more embodiments of the present disclosure.

FIG. 2A is a cross-sectional view of a structure of a display element that may be included in the display element layer DEL of FIG. 1B, according to one or more embodiments of the present disclosure. FIGS. 2B through 2E are cross-sectional views of structures of display elements, according to one or more embodiments of the present disclosure.

Referring to FIG. 2A, an organic light-emitting diode OLED as the display element, according to one or more embodiments, may include a sub-pixel electrode 301, an opposite electrode 305, and an intermediate layer 303 between the sub-pixel electrode 301 (a first electrode, e.g., an anode) and the opposite electrode 305 (a second electrode, e.g., a cathode).

The sub-pixel electrode 301 may include a transmissive conductive oxide, such as indium tin oxide (ITO), indium zinc oxide (IZO), ZnO, indium oxide ($In_2O_3$), indium gallium oxide (IGO), and/or aluminum zinc oxide (AZO). The sub-pixel electrode 301 may include a reflective layer including Ag, Mg, Al, Pt, Pd, Au, Ni, Nd, Ir, Cr, and/or a compound thereof. For example, the sub-pixel electrode 301 may have a triple-layered structure of ITO/Ag/ITO.

The opposite electrode 305 may be arranged on (or at) the intermediate layer 303. The opposite electrode 305 may include a metal having a low work function, an alloy, an electrically conductive compound, and/or a suitable combination thereof. For example, the opposite electrode 305 may include Li, Ag, Mg, Al, Al—Li, Ca, Mg—In, Mg—Ag, Yb, Ag—Yb, ITO, IZO, and/or an arbitrary combination thereof.

The opposite electrode 305 may include a transmissive electrode, a transflective electrode, and/or a reflection electrode.

The intermediate layer 303 may include a high molecular-weight organic material or a low molecular-weight organic material emitting a certain color of light. The intermediate layer 303 may further include a metal-containing compound, such as an organic metal compound, and/or an inorganic material, such as quantum dots, in addition to various organic materials.

According to one or more embodiments, the intermediate layer 303 may include an emission layer and a first functional layer and a second functional layer below and above the emission layer, respectively. The first functional layer may include, for example, a hole transport layer HTL, or a hole transport layer HTL and a hole injection layer HIL. The second functional layer may be arranged above the emission layer and may be optional. The second functional layer may include an electron transport layer ETL and/or an electron injection layer EIL.

According to one or more embodiments, the intermediate layer 303 may include at least two emitting units (as shown, for example, by emitting units EU1 and EU2 in FIG. 2B) and a charge generation layer CGL (as shown, for example, in FIG. 2B), wherein the at least two emitting units may be sequentially stacked between the sub-pixel electrode 301 and the opposite electrode 305, and the charge generation layer CGL may be arranged between the at least two emitting units. When the intermediate layer 303 includes emitting units and a charge generation layer CGL, the organic light-emitting diode OLED may be a tandem light-emitting device. The organic light-emitting diode OLED may have a stack structure of a plurality of emitting units, and thus, may have increased color purity and emission efficiency.

An emitting unit may include an emission layer and a first functional layer and a second functional layer below and above the emission layer, respectively. The charge generation layer CGL may include a negative charge generation layer and a positive charge generation layer. The organic light-emitting diode OLED having the aforementioned structure is a tandem light-emitting device including a plurality of emission layers, and based on the negative charge generation layer and the positive charge generation layer, it may have increased emission efficiency.

The negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

Figure 2B:
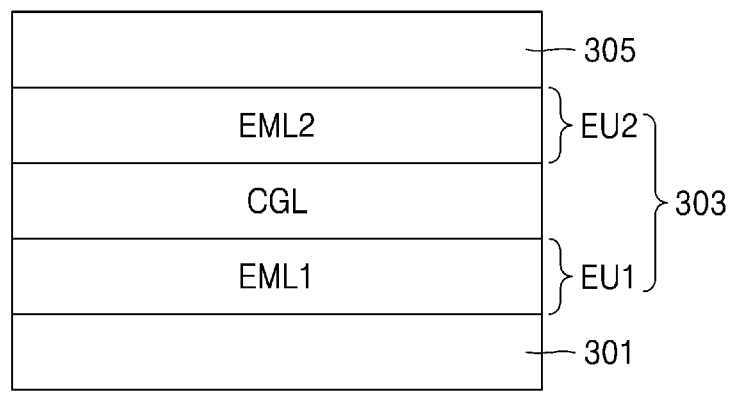

According to one or more embodiments, as illustrated in FIG. 2B, the organic light-emitting diode OLED may include a first emitting unit EU1 including a first emission layer EML1 and a second emitting unit EU2 including a second emission layer EML2, the first emitting unit EU1 and the second emitting unit EU2 being sequentially stacked. The charge generation layer CGL may be provided between the first emitting unit EU1 and the second emitting unit EU2. For example, the organic light-emitting diode OLED may include the sub-pixel electrode 301, the first emission layer EML1, the charge generation layer CGL, the second emission layer EML2, and the opposite electrode 305 that are sequentially stacked. A first functional layer and a second functional layer may be included below and above the first emission layer EML1, respectively. The first functional layer and the second functional layer may be included below and above the second emission layer EML2, respectively. The first emission layer EML1 may be a blue emission layer, and the second emission layer EML2 may be a yellow emission layer.

Figure 2C:
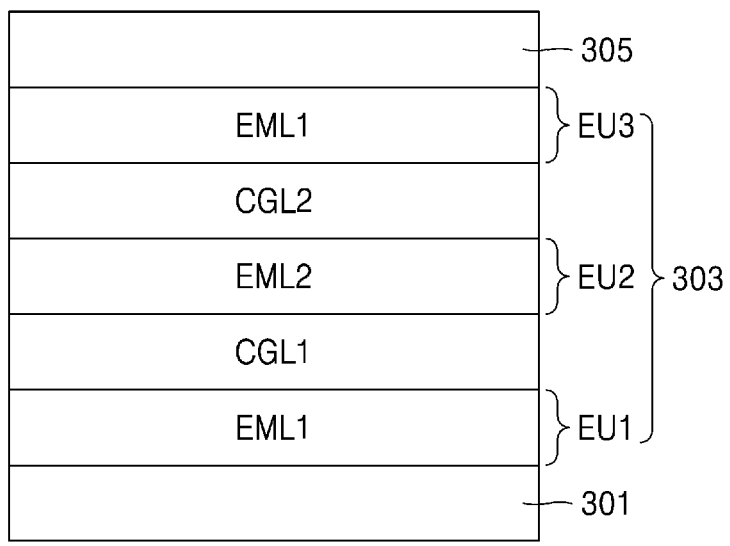

According to one or more embodiments, as illustrated in FIG. 2C, the organic light-emitting diode OLED may include the first emitting unit EU1 and a third emitting unit EU3 including the first emission layer EML1 and the second emitting unit EU2 including the second emission layer EML2. A first charge generation layer CGL1 may be provided between the first emitting unit EU1 and the second emitting unit EU2, and a second charge generation layer CGL2 may be provided between the second emitting unit EU2 and the third emitting unit EU3. For example, the organic light-emitting diode OLED may include the sub-pixel electrode 301, the first emission layer EML1, the first charge generation layer CGL1, the second emission layer EML2, the second charge generation layer CGL2, the first emission layer EML1, and the opposite electrode 305 that are sequentially stacked. The first functional layer and the second functional layer may be included below and above the first emission layer EML1, respectively. The first functional layer and the second functional layer may be included below and above the second emission layer EML2, respectively. The first emission layer EML1 may be a blue emission layer, and the second emission layer EML2 may be a yellow emission layer.

According to one or more embodiments, the organic light-emitting diode OLED may include the second emitting unit EU2 that may further include a third emission layer EML3 and/or a fourth emission layer EML4 directly contacting the second emission layer EML2 below and/or above the second emission layer EML2, in addition to the second emission layer EML2 (as shown, for example, in FIGS. 2D and 2E). In these embodiments, to directly contact may denote that no layer may be arranged between the second emission layer EML2 and the third emission layer EML3 and/or between the second emission layer EML2 and the fourth emission layer EML4. The third emission layer EML3 may be a red emission layer, and the fourth emission layer EML4 may be a green emission layer.

Figure 2D:
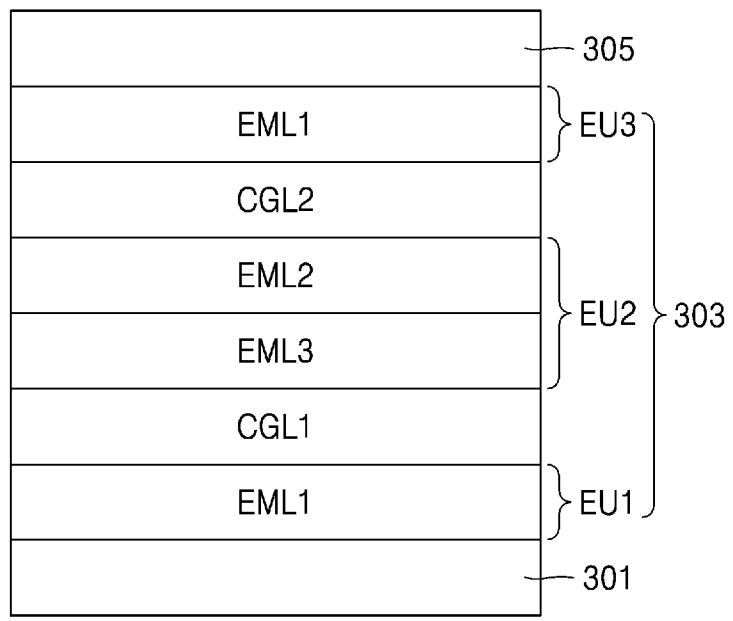

For example, as illustrated in FIG. 2D, the organic light-emitting diode OLED may include the sub-pixel electrode 301, the first emission layer EML1, the first charge generation layer CGL1, the third emission layer EML3, the second emission layer EML2, the second charge generation layer CGL2, the first emission layer EML1, and the opposite electrode 305 that are sequentially stacked. In one or more embodiments, as illustrated in FIG. 2E, the organic light-emitting diode OLED may include the sub-pixel electrode 301, the first emission layer EML1, the first charge generation layer CGL1, the third emission layer EML3, the second emission layer EML2, the fourth emission layer EML4, the second charge generation layer CGL2, the first emission layer EML1, and the opposite electrode 305 that are sequentially stacked.

Figure 2E:
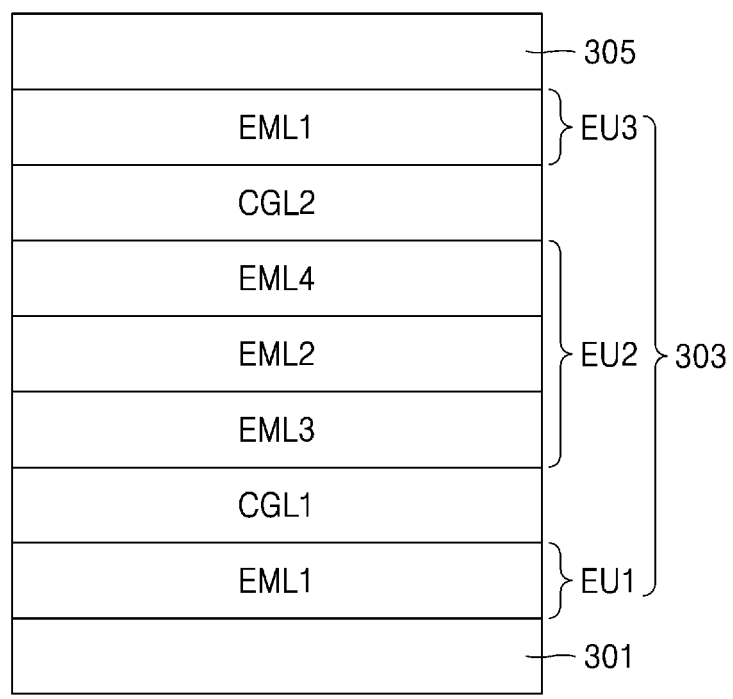
Figure 3A:
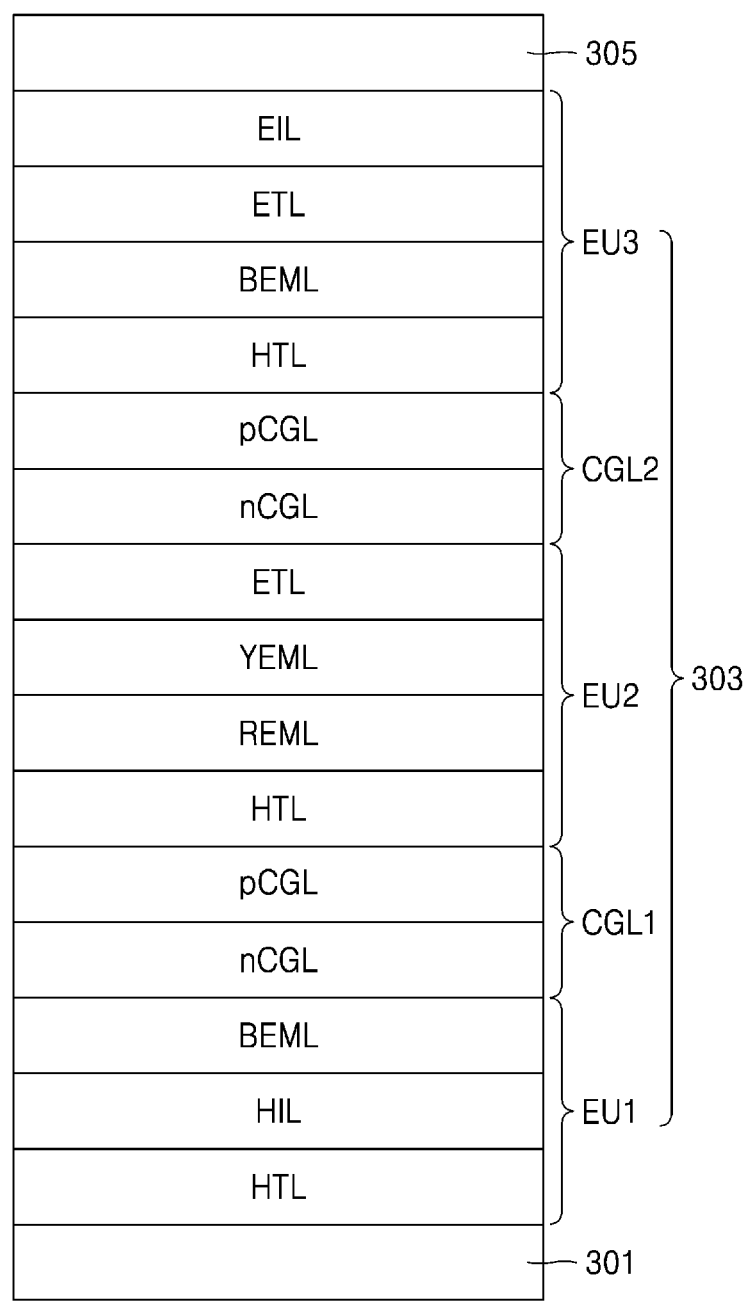
FIG. 3A is a cross-sectional view of an example of an organic light-emitting diode of FIG. 2D according to one or more embodiments of the present disclosure.
Figure 3B:
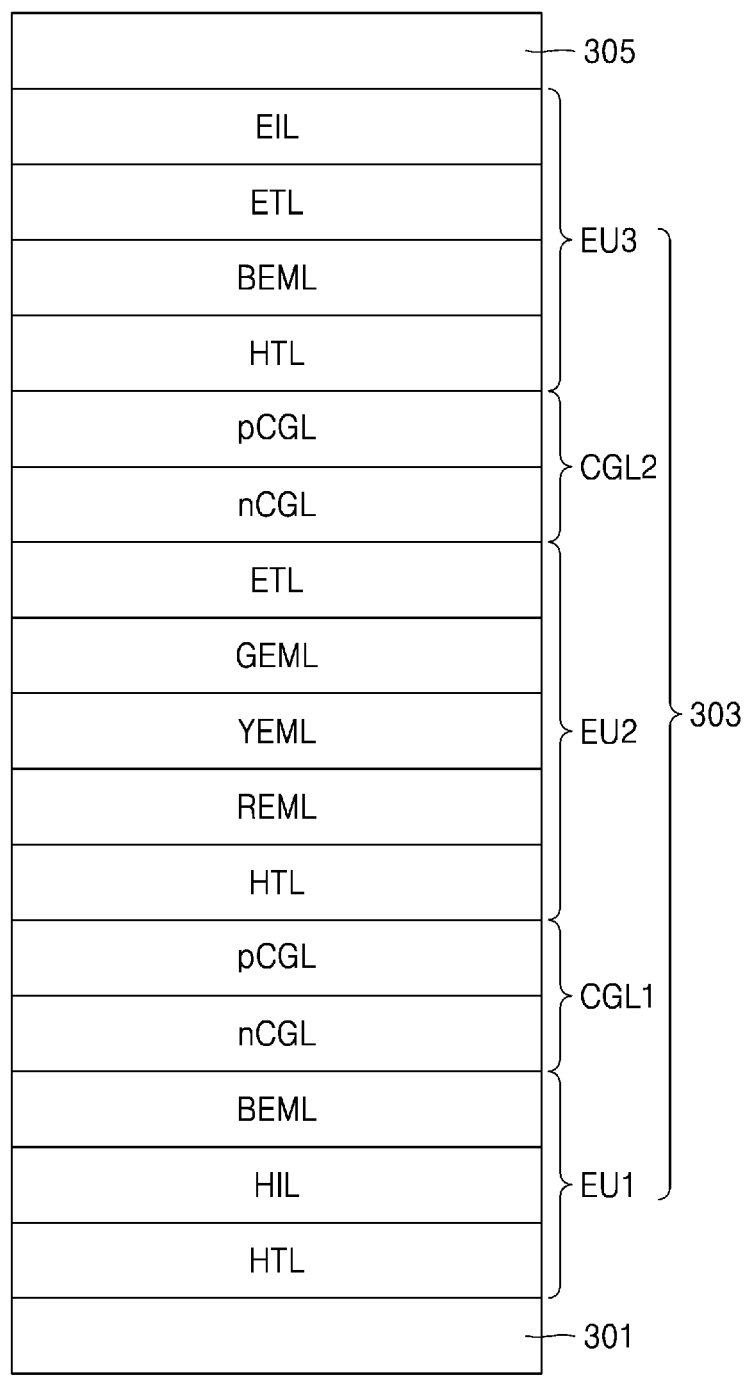
FIG. 3B is a cross-sectional view of an example of an organic light-emitting diode of FIG. 2E according to one or more embodiments of the present disclosure.

FIG. 3A is a cross-sectional view of an example of the organic light-emitting diode OLED of FIG. 2D according to one or more embodiments of the present disclosure, and FIG. 3B is a cross-sectional view of an example of the organic light-emitting diode OLED of FIG. 2E according to one or more embodiments of the present disclosure.

Referring to FIG. 3A, the organic light-emitting diode OLED may include the first emitting unit EU1, the second emitting unit EU2, and the third emitting unit EU3 that are sequentially stacked. The first charge generation layer CGL1 may be provided between the first emitting unit EU1 and the second emitting unit EU2, and the second charge generation layer CGL2 may be provided between the second emitting unit EU2 and the third emitting unit EU3. Each of the first charge generation layer CGL1 and the second charge generation layer CGL2 may include a negative charge generation layer nCGL and a positive charge generation layer pCGL.

The first emitting unit EU1 may include a blue emission layer BEML. The first emitting unit EU1 may further include a hole injection layer HIL and a hole transport layer HTL between the sub-pixel electrode 301 and the blue emission layer BEML. According to one or more embodiments, a p-doping layer may further be included between the hole injection layer HIL and the hole transport layer HTL. The p-doping layer may be formed by doping the hole injection layer HIL with a p-type doing material. According to one or more embodiments, at least one of a blue light auxiliary layer, an electron block layer, and/or a buffer layer may further be included between the blue emission layer BEML and the hole transport layer HTL. The blue light auxiliary layer may increase the emission efficiency of the blue emission layer BEML. The blue light auxiliary layer may increase the emission efficiency of the blue emission layer BEML by adjusting a hole charge balance. The electron block layer may prevent (or substantially prevent) the injection of electrons into the hole transport layer HTL. The buffer layer may compensate for a resonance distance according to a wavelength of the light emitted from the emission layer.

The second emitting unit EU2 may include a yellow emission layer YEML and a red emission layer REML directly contacting the yellow emission layer YEML below the yellow emission layer YEML. The second emitting unit EU2 may further include a hole transport layer HTL between the positive charge generation layer pCGL of the first charge generation layer CGL1 and the red emission layer REML and may further include an electron transport layer ETL between the yellow emission layer YEML and the negative charge generation layer nCGL of the second charge generation layer CGL2.

The third emitting unit EU3 may include the blue emission layer BEML. The third emitting unit EU3 may further include a hole transport layer HTL between the positive charge generation layer pCGL of the second charge generation layer CGL2 and the blue emission layer BEML. The third emitting unit EU3 may further include an electron transport layer ETL and an electron injection layer EIL between the blue emission layer BEML and the opposite electrode 305. The electron transport layer ETL may include a single layer or multiple layers. According to one or more embodiments, at least one of a blue light auxiliary layer, an electron block layer, and/or a buffer layer may further be included between the blue emission layer BEML and the hole transport layer HTL. At least one of a hole block layer and/or a buffer layer may further be included between the blue emission layer BEML and the electron transport layer ETL. The hole block layer may prevent (or substantially prevent) the injection of holes into the electron transport layer ETL.

The second emitting unit EU2 of organic light-emitting diode OLED illustrated in FIG. 3B may have a different stack structure than the second emitting unit EU2 of the organic light-emitting diode OLED illustrated in FIG. 3A, and except for the stack structure of the second emitting unit EU2, the organic light-emitting diode of FIG. 3B may have the same structure as the organic light-emitting diode OLED illustrated in FIG. 3A. Referring to FIG. 3B, the second emitting unit EU2 may include the yellow emission layer YEML, the red emission layer REML directly contacting the yellow emission layer YEML below the yellow emission layer YEML, and a green emission layer GEML directly contacting the yellow emission layer YEML above the yellow emission layer YEML. The second emitting unit EU2 may further include a hole transport layer HTL between the positive charge generation layer pCGL of the first charge generation layer CGL1 and the red emission layer REML and may further include an electron transport layer ETL between the green emission layer GEML and the negative charge generation layer nCGL of the second charge generation layer CGL2.

Figure 3C:
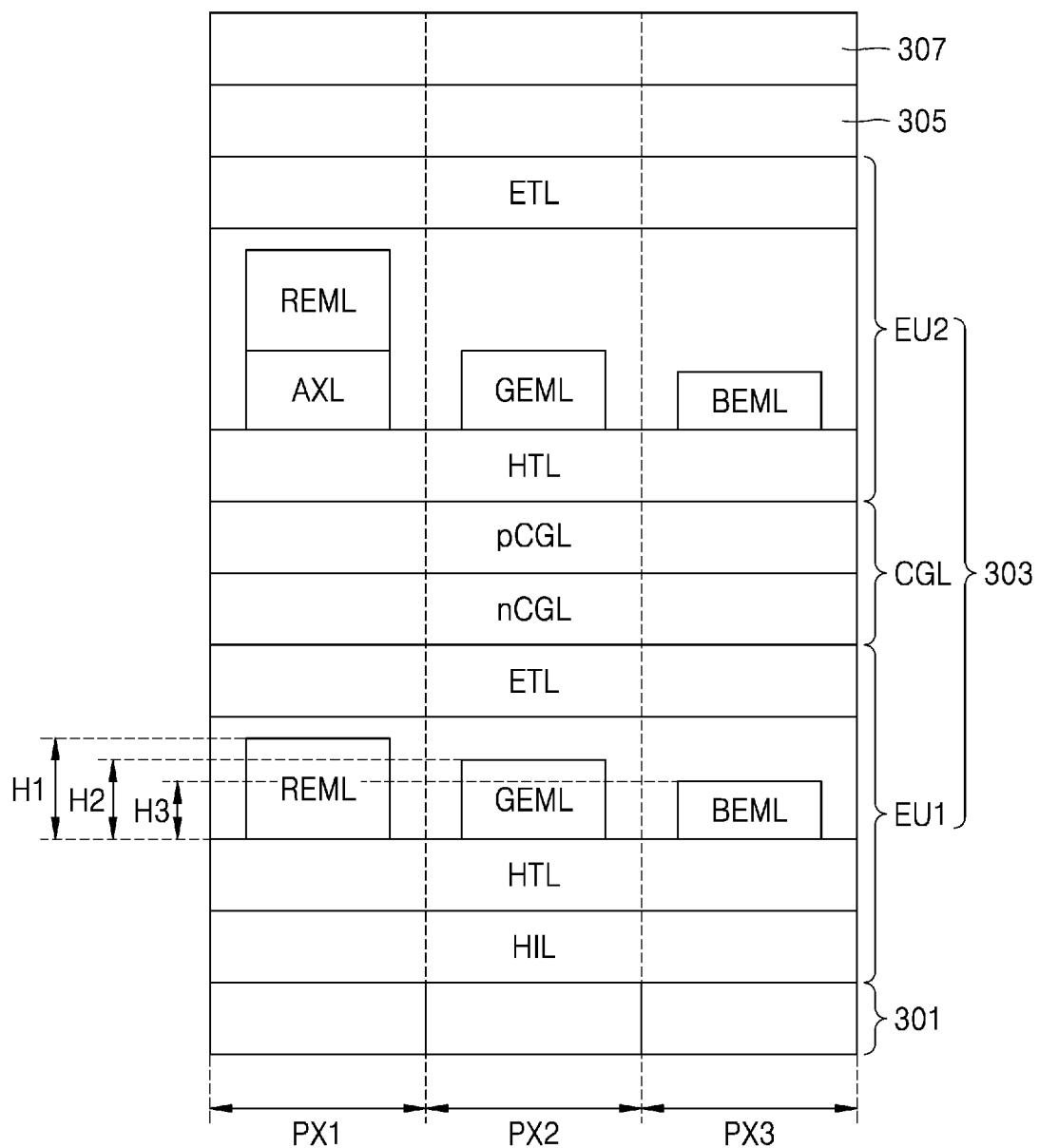
FIG. 3C is a cross-sectional view of a structure of sub-pixels of a display apparatus according to one or more embodiments of the present disclosure.

FIG. 3C is a cross-sectional view of a structure of sub-pixels of a display apparatus according to one or more embodiments the present disclosure.

Referring to FIG. 3C, according to one or more embodiments, a first sub-pixel PX1 may be a red sub-pixel, a second sub-pixel PX2 may be a green sub-pixel, and a third sub-pixel PX3 may be a blue sub-pixel. The third sub-pixel PX3 may include the sub-pixel electrode 301, the opposite electrode 305, and the intermediate layer 303.

The sub-pixel electrode 301 may be separately provided in each of the first sub-pixel PX1, the second sub-pixel PX2, and the third sub-pixel PX3.

The intermediate layer 303 of each of the first through third sub-pixels PX1 through PX3 may include: the first emitting unit EU1 and the second emitting unit EU2 that are sequentially stacked; and the charge generation layer CGL between the first emitting unit EU1 and the second emitting unit EU2. The charge generation layer CGL may include the negative charge generation layer nCGL and the positive charge generation layer pCGL. The charge generation layer CGL may be a common layer continually formed throughout the first through third sub-pixels PX1 through PX3.

The first emitting unit EU1 of the first sub-pixel PX1 may include the hole injection layer HIL, the hole transport layer HTL, the red emission layer REML, and the electron transport layer ETL that are sequentially stacked on the sub-pixel electrode 301. The first emitting unit EU1 of the second sub-pixel PX2 may include the hole injection layer HIL, the hole transport layer HTL, the green emission layer GEML, and the electron transport layer ETL that are sequentially stacked on the sub-pixel electrode 301. The first emitting unit EU1 of the third sub-pixel PX3 may include the hole injection layer HIL, the hole transport layer HTL, the blue emission layer BEML, and the electron transport layer ETL that are sequentially stacked on the sub-pixel electrode 301. Each of the hole injection layer HIL, the hole transport layer HTL, and the electron transport layer ETL of each of the first emitting units EU1 may be a common layer continually formed throughout the first through third sub-pixels PX1 through PX3.

The second emitting unit EU2 of the first sub-pixel PX1 may include the hole transport layer HTL, an auxiliary layer AXL, the red emission layer REML, and the electron transport layer ETL that are sequentially stacked on the charge generation layer CGL. The second emitting unit EU2 of the second sub-pixel PX2 may include the hole transport layer HTL, the green emission layer GEML, and the electron transport layer ETL that are sequentially stacked on the charge generation layer CGL. The second emitting unit EU2 of the third sub-pixel PX3 may include the hole transport layer HTL, the blue emission layer BEML, and the electron transport layer ETL that are sequentially stacked on the charge generation layer CGL. Each of the hole transport layer HTL and the electron transport layer ETL of each of the second emitting units EU2 may be a common layer continually formed throughout the first through third sub-pixels PX1 through PX3. According to one or more embodiments, in the second emitting units EU2 of the first through third sub-pixels PX1 through PX3, at least one of a hole block layer and/or a buffer layer may further be included between the emission layer and the electron transport layer ETL.

A thickness H1 of the red emission layer REML, a thickness H2 of the green emission layer GEML, and a thickness H3 of the blue emission layer BEML may be determined according to a resonance distance. The auxiliary layer AXL may be an area added to adjust the resonance distance and may include a resonance auxiliary material. For example, the auxiliary layer AXL may include the same material as the hole transport layer HTL.

FIG. 3C illustrates that the auxiliary layer AXL may be included in only the first sub-pixel PX1. However, the present disclosure is not limited thereto. For example, the auxiliary layer AXL may be provided in at least one of the first through third sub-pixels PX1 through PX3 to adjust the resonance distance of the at least one of the first through third sub-pixels PX1 through PX3.

The display apparatus may further include a capping layer 307 arranged outside the opposite electrode 305. The capping layer 307 may increase emission efficiency based on a constructive interference principle. Therefore, because the light extraction efficiency of the organic light-emitting diode OLED is increased, the emission efficiency of the organic light-emitting diode OLED may be increased.

Figure 4:
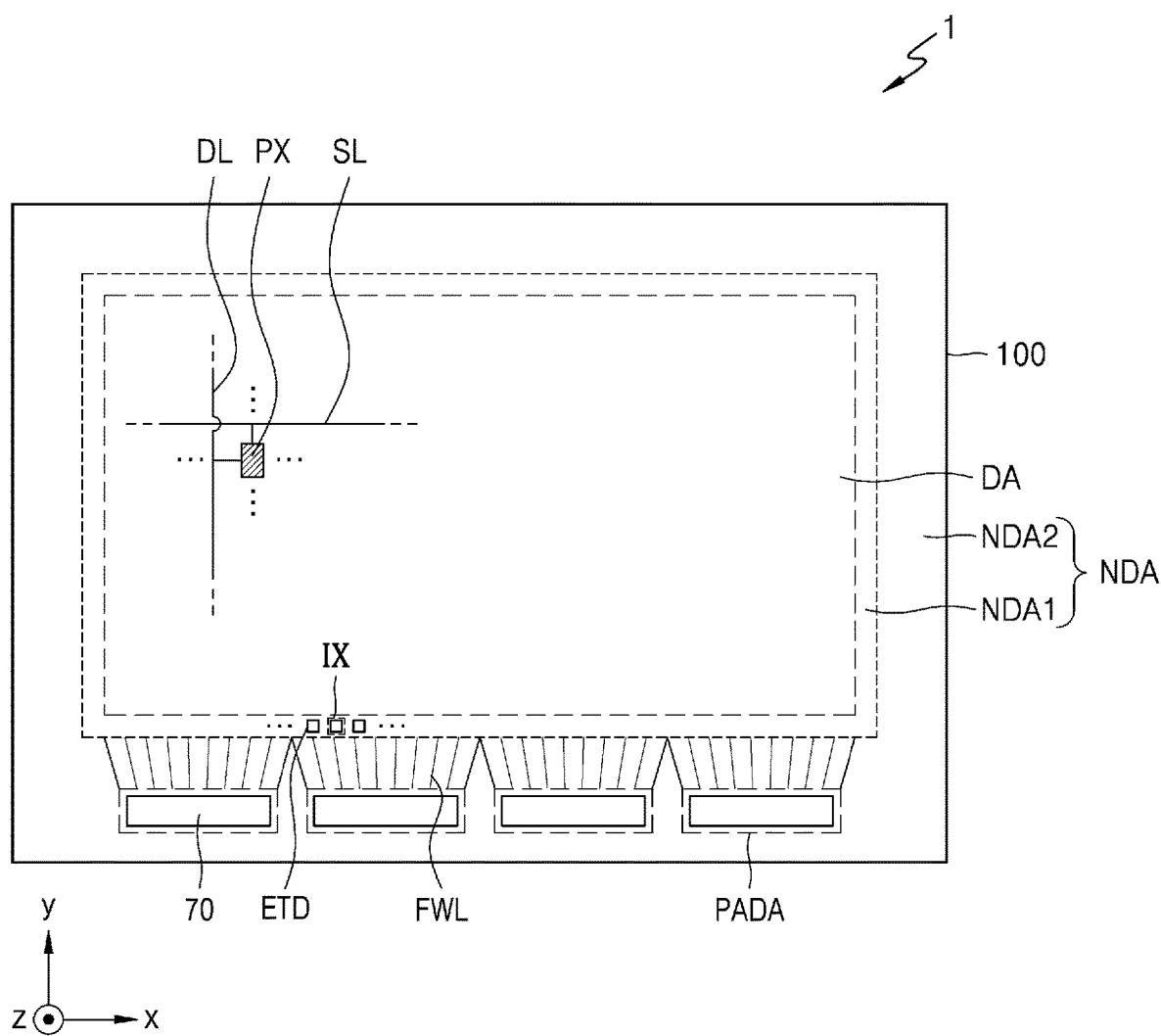
FIG. 4 is a schematic plan view of a display apparatus according to one or more embodiments of the present disclosure.

FIG. 4 is a schematic plan view of the display apparatus 1 according to one or more embodiments of the present disclosure.

Referring to FIG. 4, the display apparatus 1 may include the substrate 100, the sub-pixel PX, a scan line SL, a data line DL, an electrostatic diode ETD, a fan-out line FWL, and a driver 70.

The substrate 100 may include the display area DA and the non-display area NDA. The display area DA may be an area in which the display apparatus 1 may provide an image. The sub-pixel PX may be arranged in the display area DA and may be provided in a multiple number (e.g., the sub-pixel PX may include multiple sub-pixels PX). Each of the sub-pixels PX may be electrically connected to the scan line SL and the data line DL. The data line DL may extend in a first direction (for example, a −y direction). In a plan view, the data line DL may overlap the display area DA. A plan view, as used in the present specification, may correspond to a state in which the device or portion of the device is viewed in a z direction. The scan line SL may extend in a second direction (for example, an x direction). In a plan view, the scan line SL may overlap the display area DA.

The non-display area NDA may be an area, in which an image is not provided. According to one or more embodiments, the non-display area NDA may include a first non-display area NDA1 and a second non-display area NDA2. The first non-display area NDA1 may be arranged outside the display area DA. For example, the first non-display area NDA1 may be arranged outside the display area DA in the −y direction. Also, the first non-display area NDA1 may further be arranged outside the display area DA in the +x direction, a −x direction, and/or a +y direction. According to one or more embodiments, the first non-display area NDA1 may entirely surround (or may be around) the display area DA in a plan view. The first non-display area NDA1 may be arranged between the display area DA and the second non-display area NDA2. That is, the second non-display area NDA2 may be arranged outside the display area DA and the first non-display area NDA1.

The second non-display area NDA2 may include a pad area PADA. According to one or more embodiments, the pad area PADA may be provided in a multiple number. In other words, the pad area PADA may include a plurality of pad areas PADA. According to one or more embodiments, the pad areas PADA may be arranged in parallel with each other in the second direction (for example, the x direction). FIG. 4 illustrates that the plurality of pad areas PADA may be provided in the display apparatus 1. However, according to one or more embodiments, the display apparatus 1 may include one pad area PADA. FIG. 4 illustrates that the pad areas PADA may be arranged outside the display area DA in the −y direction. However, according to one or more embodiments, the pad area PADA may be arranged outside the display area DA in the y direction, the −x direction, and/or the x direction.

The fan-out line FWL may extend from the pad area PADA to the display area DA. In the plan view, the fan-out line FWL may overlap the second non-display area NDA2. According to one or more embodiments, the fan-out line FWL may be a signal line. The fan-out line FWL may be electrically connected to the data line DL. According to one or more embodiments, the fan-out line FWL may be a power supply line. According to one or more embodiments, the fan-out lines FWL may extend from the plurality of pad areas PADA to the display area DA.

The driver 70 may be arranged in the pad area PADA. A pad may be arranged in the pad area PADA, and the driver 70 may be electrically connected to the pad. The driver 70 may be configured to generate and output signals and/or voltages for driving the display apparatus 1. The signals and/or the voltages generated by the driver 70 may be transmitted to the sub-pixels PX arranged in the display area DA through the fan-out line FWL. The driver 70 may include an integrated circuit (IC). The driver 70 may be electrically connected to the pad by an anisotropic conductive film. In one or more embodiments, the driver 70 may be a printed circuit board (PCB). The PCB may be a flexible PCB or a rigid PCB. In one or more embodiments, the driver 70 may be a complex PCB including both of a rigid PCB and a flexible PCB. An IC may be arranged on (or at) the PCB.

Figure 5A:
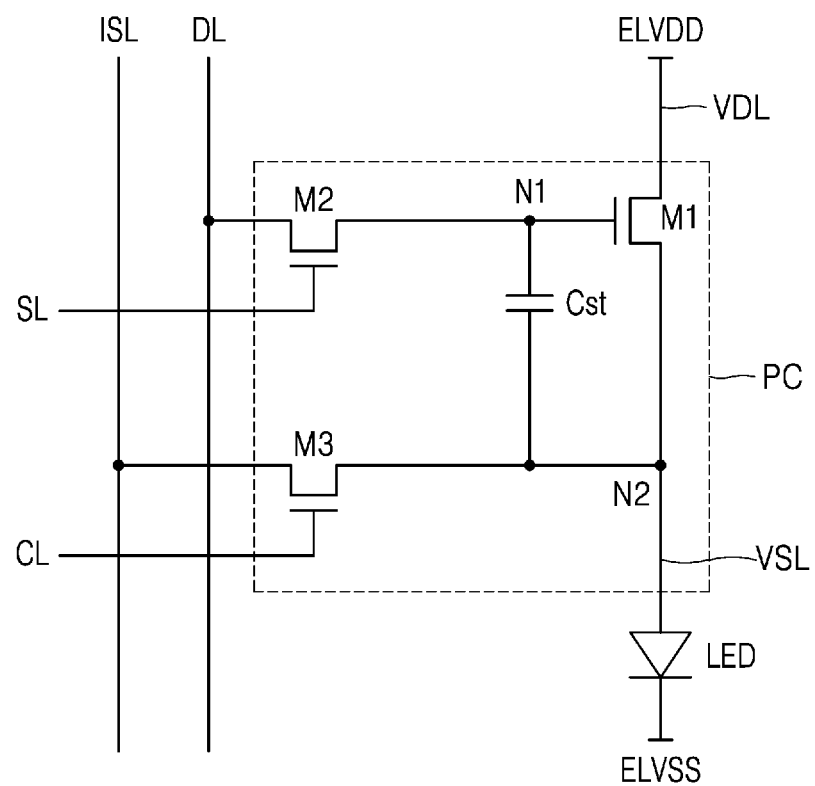
FIG. 5A is a schematic equivalent circuit diagram of a light-emitting diode included in a display apparatus and a sub-pixel circuit electrically connected to the light-emitting diode, according to one or more embodiments of the present disclosure.

The electrostatic diode ETD may be arranged in the first non-display area NDA1. The electrostatic diode ETD may be electrically connected to a portion of the data line DL extending to the first non-display area NDA1 and a portion of a voltage line. The voltage line may be a constant voltage line. According to one or more embodiments, the voltage line may be a driving voltage line VDL (FIG. 5A) or a common voltage line VSL (FIG. 5A). The portion of the data line DL and/or the portion of the voltage line (for example, the driving voltage line VDL), the portions being connected to the electrostatic diode ETD, may be electrically connected to the fan-out line FWL. The electrostatic diode ETD may be arranged in a multiple number (e.g., the electrostatic diode ETD may include multiple electrostatic diodes ETD). According to one or more embodiments, the electrostatic diodes ETD may be arranged in parallel with each other in the second direction (for example, the x direction). The electrostatic diode ETD may discharge a constant voltage flowing through the data line DL to the voltage line (for example, the driving voltage line VDL). Therefore, the electrostatic diode ETD may eliminate static electricity flowing through the data line and prevent (or substantially prevent) defects of the display apparatus 1.

The light-emitting diode LED of FIG. 5A may correspond to each of the first through third light-emitting diodes LED1 through LED3 illustrated in FIG. 1B above, and a sub-pixel circuit PC of FIG. 5A may correspond to each of the first through third sub-pixel circuits PC1 through PC3 illustrated in FIG. 1B above.

The sub-pixel circuit PC may be configured to control the amount of current flowing from a driving voltage ELVDD to a common voltage ELVSS through the light-emitting diode LED, in response to a data signal. The sub-pixel circuit PC may include a first thin-film transistor M1, a second thin-film transistor M2, a third thin-film transistor M3, and a storage capacitor Cst.

Each of the first through third thin-film transistors M1 through M3 may include an oxide semiconductor thin-film transistor including a semiconductor layer including an oxide semiconductor or may include a silicon semiconductor thin-film transistor including a semiconductor layer including polysilicon. According to the type of the thin-film transistor, a first electrode of the thin-film transistor may be one of a source electrode or a drain electrode, and a second electrode of the thin-film transistor may be the other of the source electrode or the drain electrode.

The first electrode of the first thin-film transistor M1 may be connected to the driving voltage line VDL configured to supply the driving voltage ELVDD, and the second electrode of the first thin-film transistor M1 may be connected to a first electrode of the light-emitting diode LED. A gate electrode of the first thin-film transistor M1 may be connected to a first node N1. The first thin-film transistor M1 may be configured to control the amount of currents flowing through the light-emitting diode LED from the driving voltage ELVDD, based on a voltage of the first node N1.

The second thin-film transistor M2 may include a switching thin-film transistor. The first electrode of the second thin-film transistor M2 may be connected to the data line DL, and the second electrode of the second thin-film transistor M2 may be connected to the first node N1. A gate electrode of the second thin-film transistor M2 may be connected to the scan line SL. When a scan signal is provided to the second thin-film transistor M2 through the scan line SL, the second thin-film transistor M2 may be turned on and may electrically connect the data line DL with the first node N1.

The third thin-film transistor M3 may include an initialization thin-film transistor and/or a sensing thin-film transistor. The first electrode of the third thin-film transistor M3 may be connected to a second node N2, and the second electrode of the third thin-film transistor M3 may be connected to a sensing line ISL. A gate electrode of the third thin-film transistor M3 may be connected to a control line CL.

The storage capacitor Cst may be connected between the first node N1 and the second node N2. For example, a first capacitor electrode of the storage capacitor Cst may be connected to the gate electrode of the first thin-film transistor M1, and a second capacitor electrode of the storage capacitor Cst may be connected to the first electrode of the light-emitting diode LED.

FIG. 5A illustrates that the first through third thin-film transistors M1 through M3 are n-type metal oxide semiconductor (NMOS) transistors. However, the present disclosure is not limited thereto. For example, at least one of the first thin-film transistor M1, the second thin-film transistor M2, and/or the third thin-film transistor M3 may be provided as a p-type metal oxide semiconductor (PMOS) transistor.

FIG. 5A illustrates three thin-film transistors. However, the present disclosure is not limited thereto. The sub-pixel circuit PC may include four or more thin-film transistors.

Figure 5B:
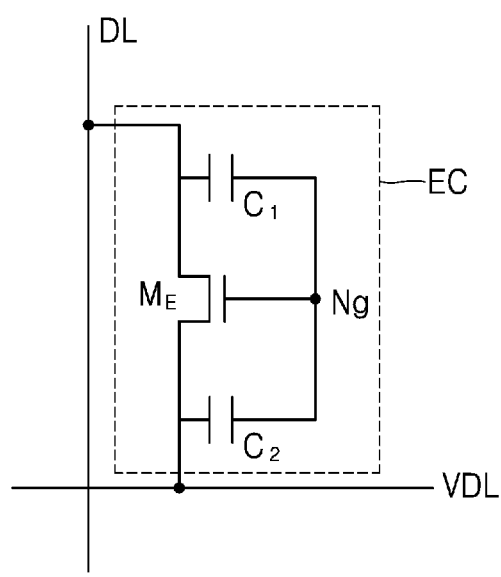
FIG. 5B is a schematic equivalent circuit diagram of an electrostatic diode included in a display apparatus according to one or more embodiments of the present disclosure.

FIG. 5B is a schematic equivalent circuit diagram of an electrostatic diode included in a display apparatus according to one or more embodiments of the present disclosure.

As illustrated in FIG. 5B, a first circuit EC corresponding to the electrostatic diode ETD may include a thin-film transistor $M_E$, a first capacitor C1, and a second capacitor C2 that are connected between the data line DL and a voltage line (for example, the driving voltage line VDL).

The first capacitor C1 may be formed between a gate node Ng connected to a gate electrode of the thin-film transistor $M_E$ and the data line DL. The second capacitor C2 may be formed between the gate node Ng and a power line (for example, the driving voltage line VDL).

The voltage line may be a constant voltage line and may be connected to any one of the driving voltage ELVDD, the common voltage ELVSS, a reference voltage Vref, a gate high voltage VGH, a gate low voltage VGL, and a ground voltage Ground.

When the first circuit EC is configured to discharge static electricity of a high voltage (a plus (+) polarity) induced for the data line DL, the first circuit EC may be connected to the power line configured to apply a high voltage, such as the driving voltage ELVDD or the gate high voltage VGH. When the first circuit EC is configured to discharge static electricity of a low voltage (a minus (−) polarity) induced for the data line DL, the first circuit EC may be connected to the power line configured to apply a low voltage, such as the common voltage ELVSS, the gate low voltage VGL, or the ground voltage Ground. For example, FIG. 5B illustrates that the voltage line may correspond to the driving voltage line VDL configured to supply the driving voltage ELVDD. However, according to one or more embodiments, the voltage line may correspond to the common voltage line VSL configured to supply the common voltage ELVSS.

When a normal data voltage is applied to the data line DL connected to the first circuit EC, the thin-film transistor $M_E$ may be insulated from the data voltage by the first capacitor C1, and thus, the thin-film transistor $M_E$ may be maintained turned-off. Therefore, currents may not flow through the first circuit EC.

When an abnormal voltage, that is, static electricity ΔV, is applied to the data line DL connected to the first circuit EC, a voltage may be generated in a gate node Ng of the thin-film transistor $M_E$ by the first capacitor C1. When a capacitance of the first capacitor C1 and a capacitance of the second capacitor C2 are the same, the voltage in the gate node Ng of the thin-film transistor $M_E$ may correspond to ½ of the provided static electricity ΔV, and thus, the thin-film transistor $M_E$ may be turned on. Here, currents may flow from the data line DL to the power line (for example, the driving voltage line VDL), and thus, the static electricity may be discharged through the power line (for example, the driving voltage line VDL).

Figure 6A:
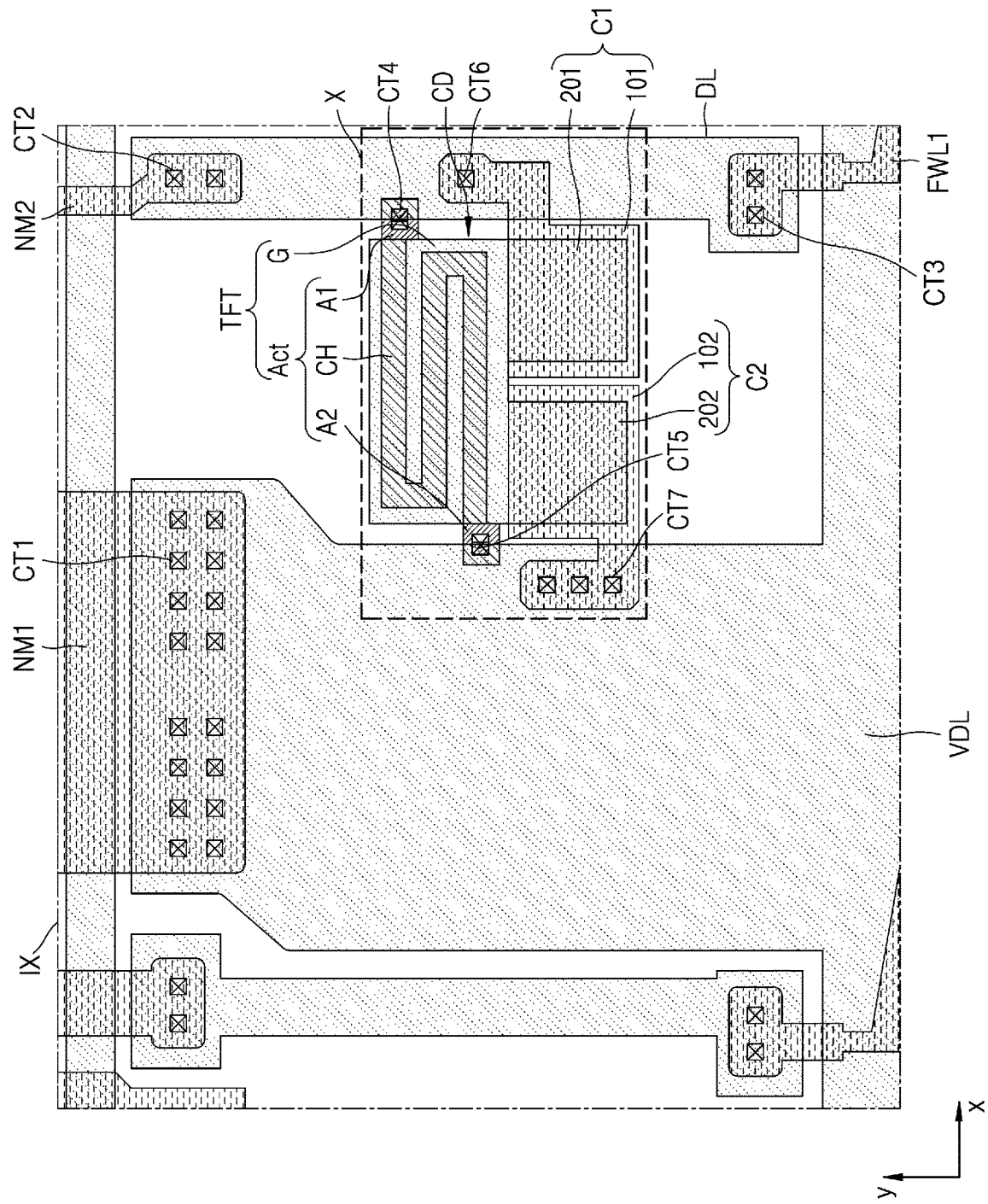
FIG. 6A is an enlarged layout view of region IX of FIG. 4 according to one or more embodiments of the present disclosure.
Figure 6B:
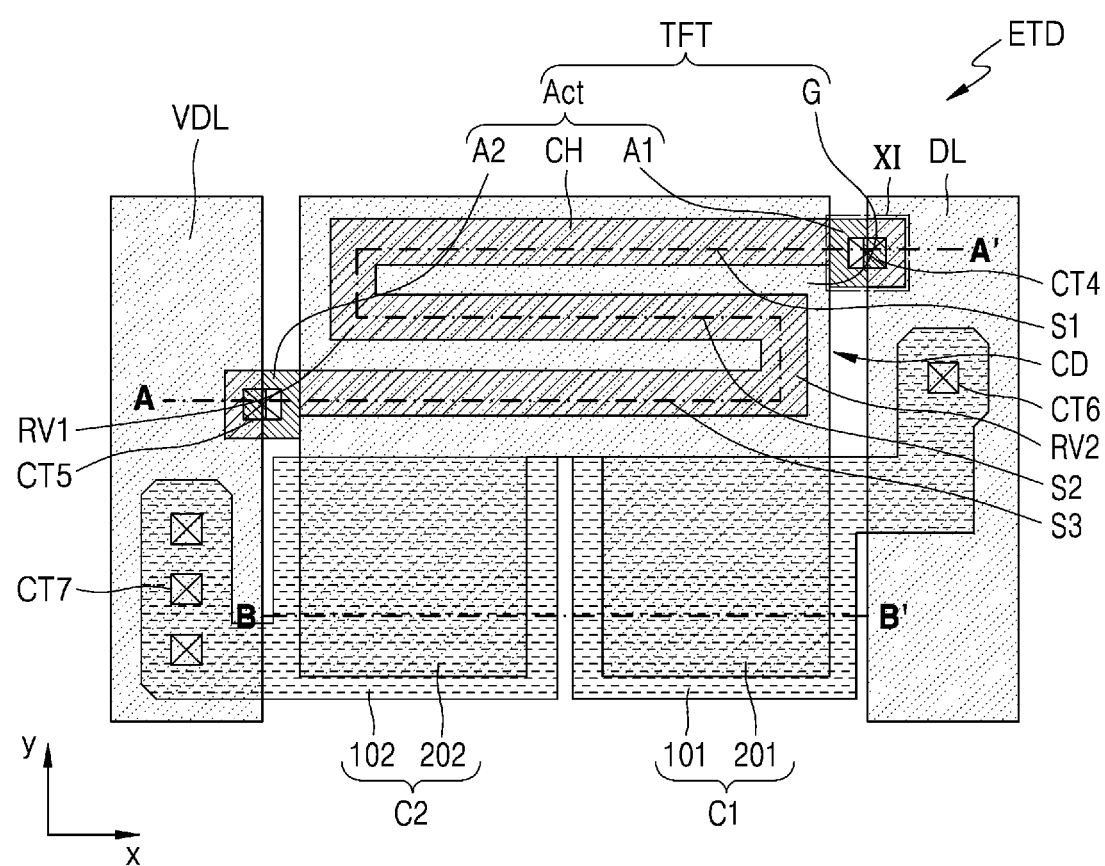
FIG. 6B is an enlarged layout view of region X of FIG. 6A according to one or more embodiments of the present disclosure.
Figure 6C:
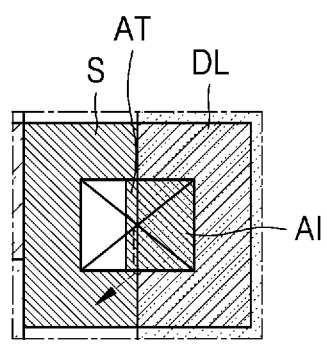
FIG. 6C is an enlarged layout view of region XI of FIG. 6B according to one or more embodiments of the present disclosure.

FIG. 6A is an enlarged layout view of region IX of FIG. 4 according to one or more embodiments of the present disclosure. FIG. 6B is an enlarged layout view of region X of FIG. 6A according to one or more embodiments of the present disclosure, and FIG. 6C is an enlarged layout view of region XI of FIG. 6B according to one or more embodiments of the present disclosure. Hereinafter, a thin-film transistor TFT may correspond to the thin-film transistor $M_E$ illustrated in FIG. 5B above.

Figure 7:
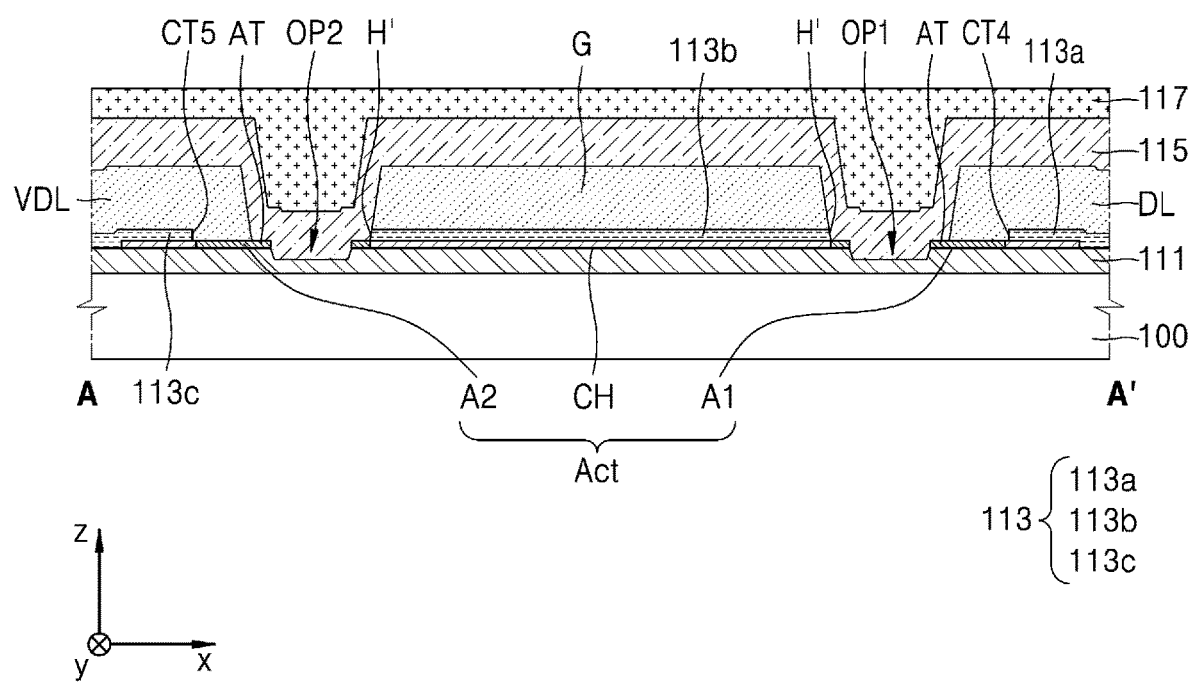
FIG. 7 is a cross-sectional view of the display apparatus, taken along the line A-A' of FIG. 6B, according to one or more embodiments of the present disclosure.

Referring to FIGS. 6A and 7, the display apparatus 1 may include the first circuit EC, the data line DL, the driving voltage line VDL, a first fan-out line FWL1, a first connection member NM1, and a second connection member NM2. The first circuit EC may include the thin-film transistor TFT, the first capacitor C1, and the second capacitor C2.

The driving voltage line VDL may extend in a first direction (a −y direction). The driving voltage line VDL may integrally extend from the display area DA to the first non-display area NDA1 (see, e.g., FIG. 4). Alternatively, a portion of the driving voltage line VDL arranged in the display area DA may be connected to a portion of the driving voltage line VDL arranged in the first non-display area NDA1 by the first connection member NM1. The first connection member NM1 may be electrically connected to a portion of the driving voltage line VDL through a first contact hole CT1.

The data line DL may extend in the first direction (for example, the −y direction). The data line DL may integrally extend from the display area DA to the first non-display area NDA1. In one or more embodiments, a portion of the data line DL arranged in the display area DA may be connected to a portion of the data line DL arranged in the first non-display area NDA1 by the second connection member NM2. The second connection member NM2 may be electrically connected to a portion of the data line DL through a second contact hole CT2. Also, a portion of the data line DL may be electrically connected to the first fan-out line FWL1 through a third contact hole CT3. The first fan-out line FWL1 may be a data signal line.

The first circuit EC (FIG. 5B) may be arranged between a portion of the data line DL and a portion of the driving voltage line VDL. For example, the driving voltage line VDL may be arranged at a side (for example, a left side) of the thin-film transistor TFT, the first capacitor C1, and the second capacitor C2 included in the first circuit EC, and the data line DL may be arranged at the other side (for example, a right side). FIGS. 6A and 6B illustrate one data line DL and one first circuit EC. However, according to one or more embodiments, the display apparatus 1 may include a plurality of data lines DL and a plurality of first circuits EC connected to the plurality of data lines DL, respectively.

The first circuit EC may include the thin-film transistor TFT. The thin-film transistor TFT may include a semiconductor layer Act and a gate electrode G. A side of the semiconductor layer Act may be electrically connected to the data line DL, and the other side of the semiconductor layer Act may be electrically connected to the driving voltage line VDL.

The semiconductor layer Act may include a first low-resistance area A1 and a second low-resistance area A2, and a channel area CH may be provided between the first low-resistance area A1 and the second low-resistance area A2. The first low-resistance area A1 and the second low-resistance area A2 may have a lower resistance than the channel area CH and may be formed by a process of doping impurities or a conductive process. Either the first low-resistance area A1 or the second low-resistance area A2 may correspond to a source area, and the other may correspond to a drain area. The gate electrode G may overlap the channel area CH.

The semiconductor layer Act may have various curved shapes. According to one or more embodiments, as illustrated in FIG. 6B, the semiconductor layer Act may include a first area S1 extending in a −x direction, a first curved portion RV1 curved at an end of the first area S1 and bent in a different direction, a second area S2 having an end connected to the first curved portion RV1 and extending in a +x direction, a second curved portion RV2 curved at an end of the second area S2 and bent in a different direction, and a third area S3 having an end connected to the second curved portion RV2, and extending in the −x direction. For example, the semiconductor layer Act may have a "ᄅ" shape in a plan view. However, the present disclosure is not limited thereto, and according to one or more embodiments, the channel area CH may have an "Ω" shape in a plan view. As described above, when the semiconductor layer Act has a curved shape in a plan view, the channel area CH may have an increased length in a narrow space. When the channel area CH has an increased length, a current path may be increased, and thus, leakage currents may be reduced.

Either the first low-resistance area A1 or the second low-resistance area A2 of the semiconductor layer Act may be electrically connected to the data line DL, and the other may be electrically connected to the driving voltage line VDL. For example, the first low-resistance area A1 may be connected to the data line DL through a fourth contact hole CT4. The second low-resistance area A2 may be connected to the driving voltage line VDL through a fifth contact hole CT5.

Referring to FIG. 6C, the data line DL may not entirely overlap the fourth contact hole CT4 in a plan view. That is, the data line DL may overlap a portion of the fourth contact hole CT4 in the plan view. In the plan view, a portion of the first low-resistance area A1, the portion directly contacting the data line DL through the fourth contact hole CT4 may be connected to a tail area AT not overlapping the data line DL, and the tail area AT may be connected to another portion S of the semiconductor layer Act, the portion S being made conductive through a path indicated by the arrow on FIG. 6C. Similarly, the driving voltage line VDL may not entirely overlap the fifth contact hole CT5 in the plan view (as shown, for example, in FIG. 5B). That is, the driving voltage line VDL may overlap a portion of the fifth contact hole CT5 in the plan view. A connection structure between the driving voltage line VDL and the second low-resistance area A2 may be substantially the same as the connection structure between the data line DL and the first low-resistance area A1, described above.

The first capacitor C1 may include a first lower electrode 101 and a first upper electrode 201 overlapping the first lower electrode 101, and the second capacitor C2 may include a second lower electrode 102, and a second upper electrode 202 overlapping the second lower electrode 102.

The first lower electrode 101 and the second lower electrode 102 may be apart (or separated) from each other in the plan view. The first lower electrode 101 of the first capacitor C1 may be connected to the data line DL through a sixth contact hole CT6. The second lower electrode 102 of the second capacitor C2 may be connected to the driving voltage line VDL through a seventh contact hole CT7.

The first capacitor C1 and the second capacitor C2 may not overlap the thin-film transistor TFT and may be arranged in different locations from each other in the plan view. The first lower electrode 101 and the second lower electrode 102 may not overlap the semiconductor layer Act and may be apart (or separated) from the semiconductor layer Act, for example, the channel area CH. According to one or more embodiments, because the first capacitor C1 and the second capacitor C2 may not overlap the semiconductor layer Act of the thin-film transistor TFT, unintended formation of a back channel in the thin-film transistor TFT, which is caused when the electrode of the capacitor overlaps the semiconductor layer Act, may be avoided (or substantially avoided). That is, issues, such as leakage currents, etc., due to a back channel formed in the thin-film transistor TFT, may be prevented (or substantially prevented).

The gate electrode G may be integrally formed with the first upper electrode 201 of the first capacitor C1 and the second upper electrode 202 of the second capacitor C2. The first upper electrode 201 and the second upper electrode 202 may have shapes protruding in a direction from the gate electrode G toward the first lower electrode 101 and the second lower electrode 102, respectively. For example, as illustrated in FIG. 6B, each of the first upper electrode 201 and the second upper electrode 202 may have a shape protruding from the gate electrode G in a second direction (for example, a −y direction).

In other words, the gate electrode G and each of the first upper electrode 201 and the second upper electrode 202 may be included in one conductor CD. The conductor CD may be arranged between the driving voltage line VDL and the data line DL and may be apart (or separated) from the driving voltage line VDL and the data line DL in the plan view. The conductor CD may overlap a portion of the semiconductor layer Act, at least a portion of the first lower electrode 101, and at least a portion of the second lower electrode 102. According to one or more embodiments, the conductor CD may have a "ㄷ" shape in the plan view.

According to one or more embodiments, the first capacitor C1 and the second capacitor C2 may have the same capacitance.

FIG. 7 is a cross-sectional view of the display apparatus 1, taken along the line A-A' of FIG. 6B, according to one or more embodiments of the present disclosure.

Referring to FIG. 7, the first circuit EC may include the thin-film transistor TFT arranged on (or at) the substrate 100. The thin-film transistor TFT may include the semiconductor layer Act and the gate electrode G at least partially overlapping the semiconductor layer Act.

The substrate 100 may include a glass material, a ceramic material, a metal material, and/or a flexible or bendable material. In the case where the substrate 100 is flexible or bendable, the substrate 100 may include polymer resins, such as polyethersulfone, polyacrylate, polyetherimide, polyethylene naphthalate, polyethylene terephthalate, polyphenylene sulfide, polyarylate, polyimide, polycarbonate, and/or cellulose acetate propionate.

The substrate 100 may have a single layer or multi-layered structure, and when the substrate 100 has a multi-layered structure, the substrate 100 may further include an inorganic material. In one or more embodiments, the substrate 100 may have a structure of an organic material/an inorganic material/an organic material.

A buffer layer 111 may be arranged on the substrate 100. The buffer layer 111 may prevent or minimize the penetration of impurities into the semiconductor layer Act from the substrate 100. The buffer layer 111 may include an inorganic material, such as an oxide or nitride, an organic material, or an organic and inorganic compound, and may have a single layer structure or a multi-layered structure including an inorganic material and/or an organic material.

The semiconductor layer Act may be arranged on (or at) the buffer layer 111. According to one or more embodiments, the semiconductor layer Act may include an oxide semiconductor. The oxide semiconductor may have a large band gap, a high carrier mobility, and a low leakage current, and thus, even when a driving time is increased, a voltage drop may not be large. Therefore, a brightness change due to the voltage drop may not be significant even during a low-frequency driving operation.

A gate insulating layer 113 (which may include, for example, 113a, 113b and 113c as shown in FIG. 7) may be arranged on (or at) the semiconductor layer Act. The gate insulating layer 113 may include a plurality of holes H' overlapping the semiconductor layer Act. Portions of the semiconductor layer Act, the portions being exposed by the plurality of holes H', may be made conductive by undergoing a plasma process and/or other suitable process(es), and the semiconductor layer Act may include the first low-resistance area A1 and the second low-resistance area A2 that are conductive.

A plurality of opening portions OP1 and OP2 may be formed in the conductive first low-resistance area A1 and second low-resistance area A2 of the semiconductor layer Act. The plurality of opening portions OP1 and OP2 may be arranged at both sides of the channel area CH. One opening portion OP1 (hereinafter, referred to as a first opening portion) may be arranged between the channel area CH and the data line DL, and the other opening portion OP2 (hereinafter referred to as a second opening portion) may be arranged between the channel area CH and the driving voltage line VDL.

The gate insulating layer 113 may be patterned. As illustrated in FIG. 7, the gate insulating layer 113 may include a first insulating pattern 113a, a second insulating pattern 113b, and a third insulating pattern 113c that are apart (or separated) from each other. The second insulating pattern 113b may overlap the channel area CH, the first insulating pattern 113a may overlap a portion of the first low-resistance area A1, and the third insulating pattern 113c may overlap a portion of the second low-resistance area A2. Both the first insulating pattern 113a and the third insulating pattern 113c may cover a respective end of the semiconductor layer Act.

Portions of the semiconductor layer Act that overlap the first through third insulating patterns 113a through 113c, may not be exposed to a plasma process, and thus, may not become conductive. Those portions may have different properties than portions of the semiconductor layer Act that are exposed to the plasma process.

A portion of the semiconductor layer Act directly below the data line DL, may include a first portion having a carrier concentration corresponding to one of the first low-resistance area A1 or the second low-resistance area A2 and a second portion having a different carrier concentration from the first portion. For example, the second portion may be covered by the first insulating pattern 113a. The second portion may have a less carrier concentration than the first portion. The second portion may include the same material as the channel area CH. In other words, the second portion may not be conductive similar to the channel area CH. The tail area AT, which does not overlap the data line DL, is adjacent to the first opening portion OP1 and conductive, and it may be connected to another conductive portion of the semiconductor layer Act.

Similarly, a portion of the semiconductor layer Act, the portion being directly below the driving voltage line VDL, may include a third portion having a carrier concentration corresponding to one of the first low-resistance area A1 or the second low-resistance area A2 and a fourth portion having a different carrier concentration from the third portion. For example, the third portion may be covered by the third insulating pattern 113c. The fourth portion may have a less carrier concentration than the third portion. The fourth portion may include the same material as the channel area CH. In other words, the fourth portion may not be conductive similar to the channel area CH. The tail area AT, which does not overlap the driving voltage line VDL, is adjacent to the second opening portion OP2 and conductive, and it may be connected to another conductive portion of the semiconductor layer Act.

The driving voltage line VDL, the data line DL, and the gate electrode G may be arranged on (or at) the same layer. For example, the driving voltage line VDL, the data line DL, and the gate electrode G may be arranged on (or at) the gate insulating layer 113. The driving voltage line VDL, the data line DL, and the gate electrode G may include the same material and may be formed by the same process.

The data line DL may partially overlap the fourth contact hole CT4 of the gate insulating layer 113. The data line DL may overlap a portion of the first low-resistance area A1 through the fourth contact hole CT4. The driving voltage line VDL may partially overlap the fifth contact hole CT5 of the gate insulating layer 113. The driving voltage line VDL may overlap a portion of the second low-resistance area A2 through the fifth contact hole CT5.

An interlayer insulating layer 115 may be arranged to cover the driving voltage line VDL, the data line DL, and the gate electrode G. The interlayer insulating layer 115 may include an inorganic insulating material, such as silicon nitride, silicon oxide, and/or silicon oxynitride, or an organic insulating material.

A planarization layer 117 may be arranged on (or at) the interlayer insulating layer 115. The planarization layer 117 may include an organic insulating material and/or an inorganic insulating material. The organic insulating material may include a general-purpose polymer, such as PMMA or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

FIGS. 8A, 8B, 8C, 8D, and 8E are cross-sectional views for sequentially describing a method of manufacturing a display apparatus, according to one or more embodiments of the present disclosure.

Figure 8A:
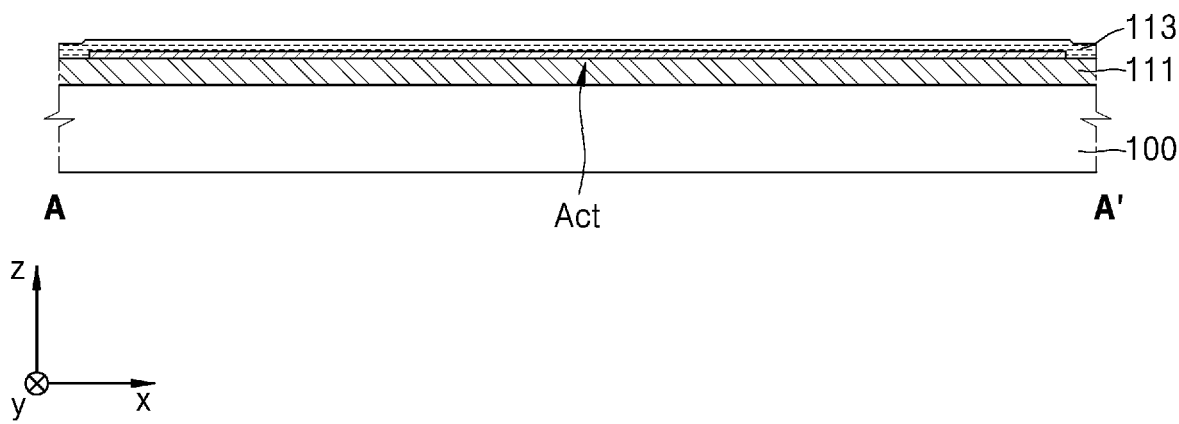
FIGS. 8A through 8E are cross-sectional views for sequentially describing a method of manufacturing the display apparatus, taken along line A-A' of FIG. 6B, according to one or more embodiments of the present disclosure.

Referring to FIG. 8A, first, the buffer layer 111 may be formed on (or at) the substrate 100. The buffer layer 111, for example, may be formed by a deposition method, such as chemical vapor deposition (CVD), sputtering, and/or other suitable process(es).

The semiconductor layer Act may be arranged on (or at) the buffer layer 111. The semiconductor layer Act may be formed by patterning a preliminary semiconductor layer. According to one or more embodiments, the semiconductor layer Act may include an oxide semiconductor. The oxide semiconductor may include indium gallium zinc oxide (IGZO), zinc tin oxide (ZTO), zinc indium oxide (ZIO), and/or other suitable material(s). FIG. 8A illustrates the semiconductor layer Act including the oxide semiconductor. However, in one or more embodiments, the preliminary semiconductor layer may include amorphous silicon and/or polysilicon. Hereinafter, a case in which the semiconductor layer Act includes an oxide semiconductor is described, according to one or more embodiments. The preliminary semiconductor layer may be deposited, for example, by CVD.

The gate insulating layer 113 may be formed on (or at) the semiconductor layer Act. The gate insulating layer 113 may be formed, for example, by deposition, such as CVD, sputtering, and/or other suitable process(es).

Figure 8B:
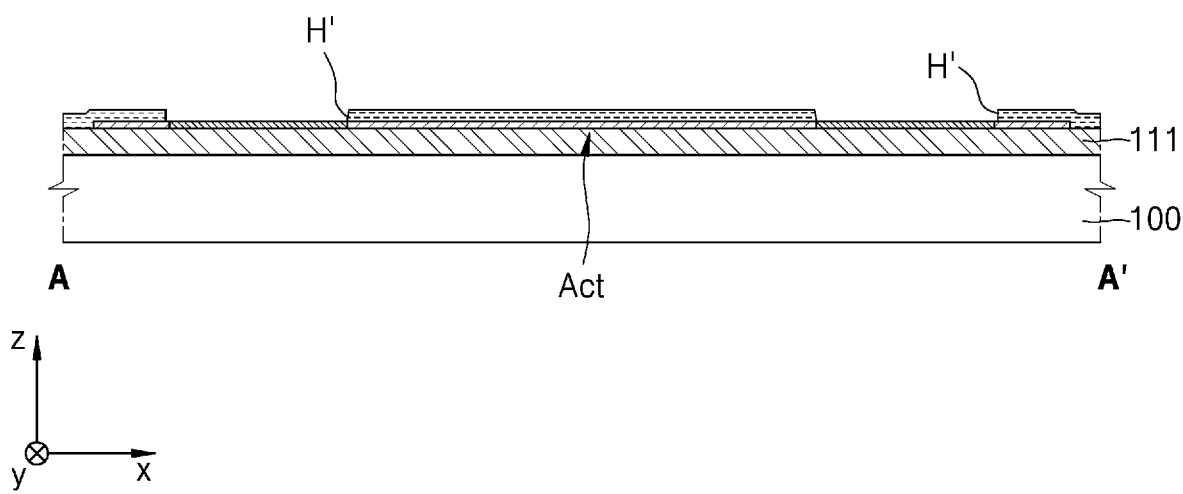

Referring to FIG. 8B, the gate insulating layer 113 may include the holes H' overlapping the semiconductor layer Act. Portions of the semiconductor layer Act may be at least partially exposed by the plurality of holes H'. The portions of the semiconductor layer Act exposed by the plurality of holes H', may be made conductive by undergoing a plasma process, and/or other suitable process(es), and as illustrated in FIG. 8B, the semiconductor layer Act may include the first low-resistance area A1 and the second low-resistance area A2 that are conductive. The holes H' may correspond to the fourth contact hole CT4 overlapping the first low-resistance area A1 and the fifth contact hole CT5 overlapping the second low-resistance area A2.

For example, the plasma process refers to a process in which particles in a plasma state, the particles having high energy, collide with a surface of a material to chemically or physically change the surface of the material. According to one or more embodiments, during the plasma process, at least one selected from a group including hydrogen gas, argon gas, helium gas, xenon gas, nitrogen gas, SiNX gas, oxygen gas, and/or a mixture thereof may be used.

When an oxide semiconductor is plasma-processed, the oxide semiconductor may be reduced, and thus, oxygen defects included in the oxide semiconductor may be induced to increase an oxygen vacancy. The oxide semiconductor having an increased oxygen vacancy may have an increased carrier concentration, and thus, a threshold voltage, which is a critical voltage according to which conductivity, one of the characteristics of the semiconductor, is generated, may have a concentration shifted to a negative direction. This denotes that the oxide semiconductor becomes highly electrically conductive.

Figure 8C:
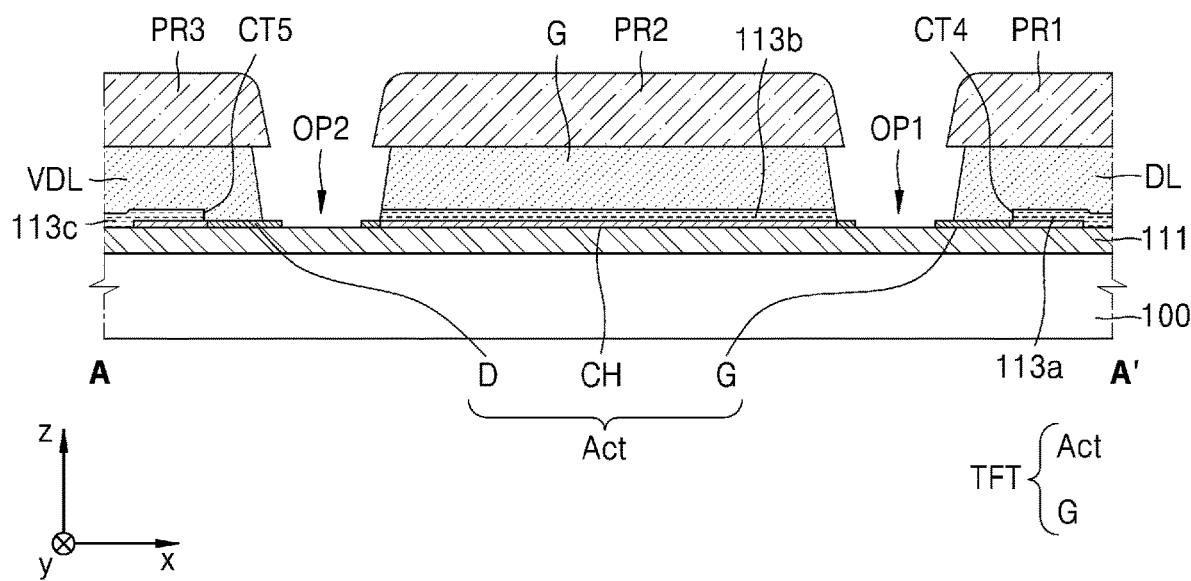

Referring to FIG. 8C, the driving voltage line VDL, the data line DL, and the gate electrode G may be formed on (or at) the gate insulating layer 113. First, the driving voltage line VDL, the data line DL, and the gate electrode G may be formed on (or at) the gate insulating layer 113 by forming a preliminary electrode layer and then patterning the preliminary electrode layer by using first through third photoresists PR1 through PR3 thereon. The preliminary electrode layer may be formed by a deposition method, such as CVD, plasma enhanced CVD (PECVD), low pressure CVD (LPCVD), physical vapor deposition (PVD), sputtering, atomic layer deposition (ALD), and/or other suitable process(es).

The preliminary electrode layer may include a single conductive layer or conductive layers. According to one or more embodiments, the preliminary electrode layer may include a conductive material including Al, Pt, Pd, Ag, Mg, Au, Ni, Nd, Ir, Cr, Li, Ca, Mo, Ti, W, and/or Cu. Also, according to one or more embodiments, the preliminary electrode layer may include a transparent conductive material. The transparent conductive material may include a conductive oxide, such as ITO, IZO, ZnO, $In_2O_3$, IGO, or AZO. According to one or more embodiments, the preliminary electrode layer may include, for example, Ti/Al/Ti.

As described above, the driving voltage line VDL, the data line DL, and the gate electrode G may be formed by forming the photoresist pattern on the preliminary electrode layer and patterning the preliminary electrode layer by using the photoresist pattern. The photoresist pattern may be formed by applying a photoresist layer and performing an exposure and development process thereon.

The photoresist pattern may include the first photoresist PR1 corresponding to a portion in (or at) which the data line DL is to be formed, the second photoresist PR2 corresponding to a portion in (or at) which the gate electrode G is to be formed, and the third photoresist PR3 corresponding to a portion in (or at) which the driving voltage line VDL is to be formed.

According to one or more embodiments, the first through third photoresists PR1 through PR3 may be exposed by using a full tone mask. However, the present disclosure is not limited thereto. According to one or more embodiments, at least one of the first through third photoresists PR1 through PR3 may be formed by applying a halftone mask or a slit to edges of four side surfaces thereof.

After the first through third photoresists PR1 through PR3 are formed, portions of the preliminary electrode layer described above, the portions not being protected by the first through third photoresists PR1 through PR3, may be etched to form the gate electrode G, the driving voltage line VDL, and the data line DL. Etching may be wet etching. Etching may be performed twice or more by varying an etchant or may be performed only once by using an identical etchant.

During the etching (for example, wet etching), portions of the conductive area of the semiconductor layer Act may be etched together, and thus, the plurality of opening portions OP1 and OP2 may be formed in the semiconductor layer Act. The plurality of opening portions OP1 and OP2 may be arranged at both sides of the channel area CH, respectively. The first opening portion OP1 may be formed between the channel area CH and the data line DL, and the second opening portion OP2 may be formed between the channel area CH and the driving voltage line VDL. The plurality of opening portions OP1 and OP2 may be formed to penetrate an upper surface and a lower surface of the semiconductor layer Act, and thus, the buffer layer 111 may be partially exposed by the plurality of opening portions OP1 and OP2. Portions of the conductive area of the semiconductor layer Act, the portions not being etched, may overlap the driving voltage line VDL and the data line DL. The tail area AT not overlapping the driving voltage line VLD or the data line DL may be connected to a portion of the semiconductor layer Act that will be made conductive in a subsequent process.

Figure 8D:
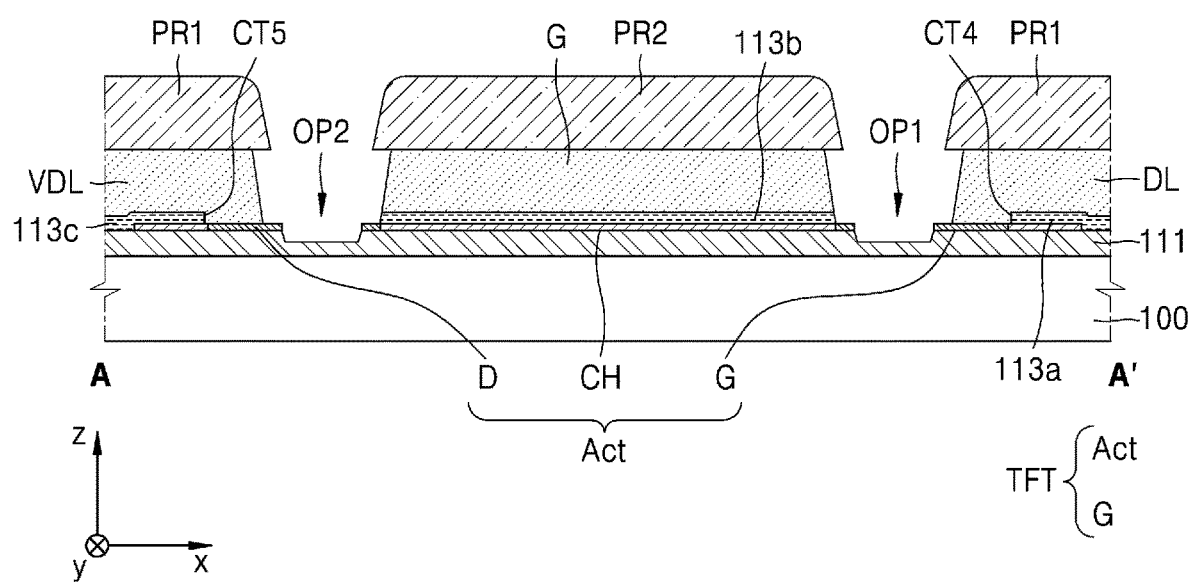
Figure 8E:
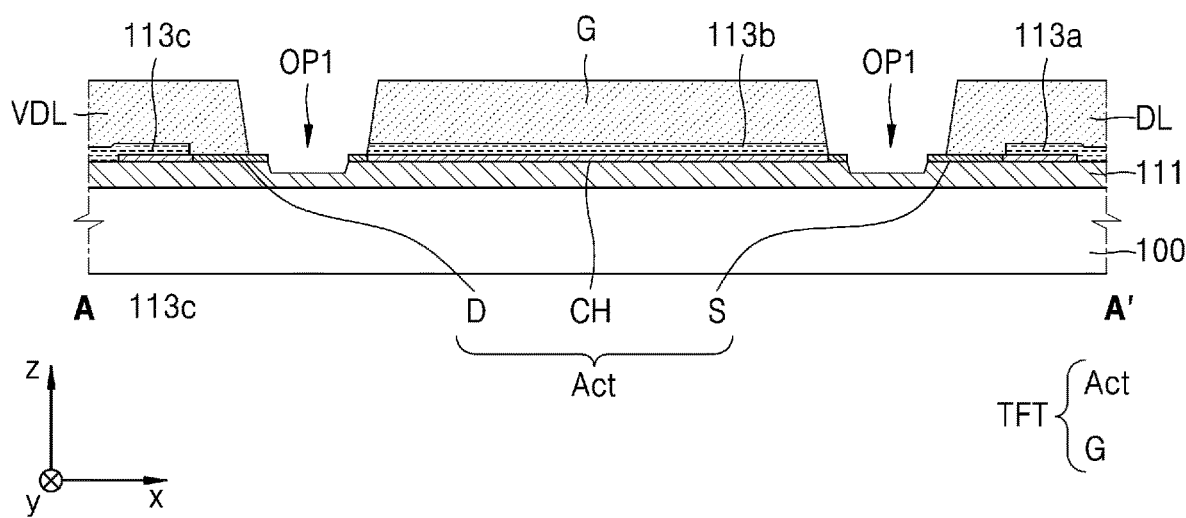

Referring to FIGS. 8D and 8E, while the first through third photoresists PR1 though PR3 are not eliminated, a portion of the gate insulating layer 113 may be etched. Thereafter, by eliminating (for example, stripping) the first through third photoresists PR1 through PR3, the thin-film transistor TFT as illustrated in FIG. 7 may be formed. The interlayer insulating layer 115 (FIG. 7) and the planarization layer 117 (FIG. 7) may be sequentially deposited thereon.

A portion of the gate insulating layer 113 may be dry etched by using the first through third photoresists PR1 through PR3. The first insulating pattern 113a, the second insulating pattern 113b, and the third insulating pattern 113c may be formed by etching a portion of the gate insulating layer 113. The first insulating pattern 113a may overlap the data line DL, the second insulating pattern 113b may overlap the gate electrode G, and the third insulating pattern 113c may overlap the driving voltage line VDL. The first insulating pattern 113a, the second insulating pattern 113b, and the third insulating pattern 113c may be spatially/physically separated from one another.

During the formation of the first through third insulating patterns 113a through 113c, a plasma process may be performed. According to one or more embodiments, the first through third insulating patterns 113a through 113c may be patterned by an etching process using a plasma. Here, portions of the semiconductor layer Act, the portions being exposed as a result of not being covered by the first through third insulating patterns 113a through 113c, may be made conductive by the plasma process.

As described above, the display apparatus 1 according to one or more embodiments may have a relatively simple stack structure, in which the driving voltage line VDL and the data line DL may be arranged on (or at) the same layer as the gate electrode G. Thus, the display apparatus 1 may be manufactured by using a relatively lower number of masks.

Figure 9:
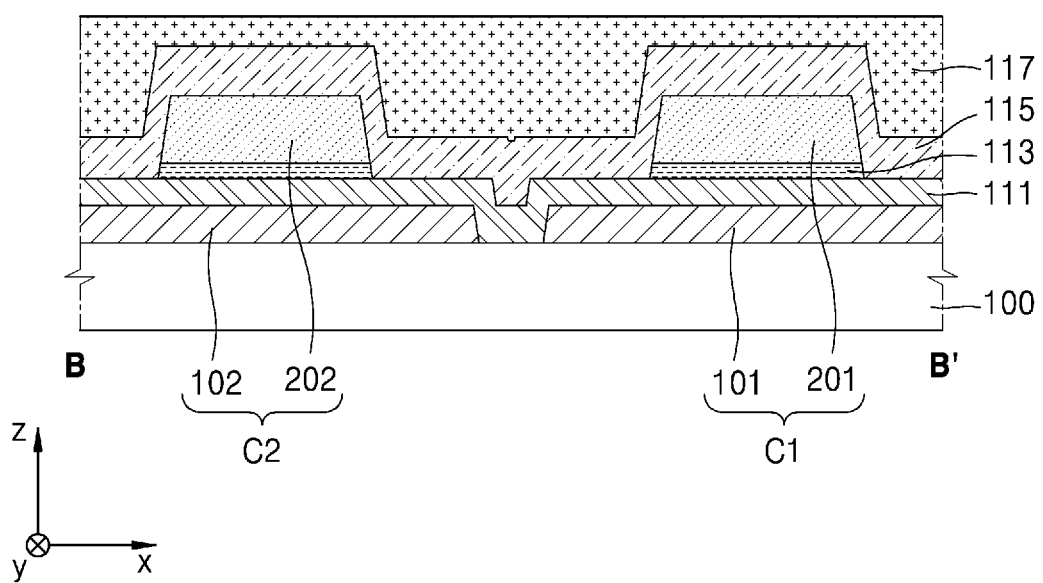
FIG. 9 is a cross-sectional view of the display apparatus, taken along the line B-B' of FIG. 6B, according to one or more embodiments of the present disclosure.

FIG. 9 is a cross-sectional view of the display apparatus 1, taken along the line B-B' of FIG. 6B, according to one or more embodiments of the present disclosure.

Referring to FIG. 9, the first circuit EC may include the first capacitor C1 and the second capacitor C2 arranged on (or at) the substrate 100. The first capacitor C1 may include the first lower electrode 101 and the first upper electrode 201, and the second capacitor C2 may include the second lower electrode 102 and the second upper electrode 202.

The first lower electrode 101 and the second lower electrode 102 may be arranged on (or at) the substrate 100. The first lower electrode 101 and the second lower electrode 102 may be arranged directly above the substrate 100 and may directly contact the substrate 100. In one or more embodiments, an insulating layer may be arranged between the first and second lower electrodes 101 and 102 and the substrate 100. The first and second lower electrodes 101 and 102 may include a conductive material including Mo, Cu, Ti, and/or other suitable material(s), and may include multiple layers or a single layer including the materials described above.

According to one or more embodiments, the first and second lower electrodes 101 and 102 may be arranged on (or at) the same layer and may include the same material as the first connection member NM1 (FIG. 6A), the second connection member NM2 (FIG. 6A), and the first fan-out line FWL1 (FIG. 6A).

The buffer layer 111 may be arranged on (or at) the first lower electrode 101 and the second lower electrode 102 arranged to be apart (or separated) from each other, and the gate insulating layer 113 may be arranged on (or at) the buffer layer 111.

The first upper electrode 201 of the first capacitor C1 and the second upper electrode 202 of the second capacitor C2 may be arranged on (or at) the gate insulating layer 113. The first upper electrode 201 and the second upper electrode 202 may overlap the first lower electrode 101 and the second lower electrode 102, respectively, with the buffer layer 111 and the gate insulating layer 113 therebetween.

The first upper electrode 201 and the second upper electrode 202 may be arranged on (or at) the same layer and may include the same material as the gate electrode G described with reference to FIG. 7. The first and second upper electrodes 201 and 202 may be formed by the same method as the gate electrode G described with reference to FIG. 8C.

The interlayer insulating layer 115 may be arranged to cover the first and second upper electrodes 201 and 202. The planarization layer 117 may be arranged on (or at) the interlayer insulating layer 115.

Figure 10:
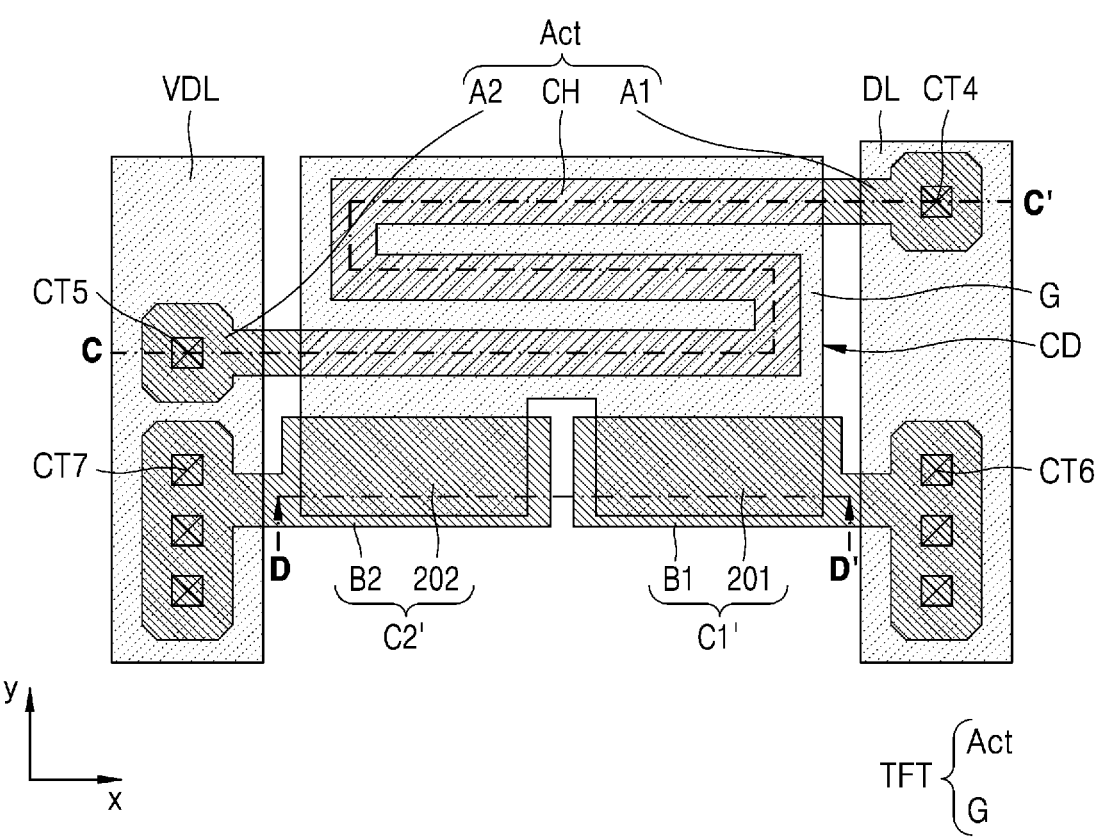
FIG. 10 is an enlarged layout view of region X of FIG. 6A, according to one or more embodiments of the present disclosure.

FIG. 10 is an enlarged layout view of region X of FIG. 6A, according to one or more embodiments of the present disclosure.

Referring to FIG. 10, the first circuit EC may include the thin-film transistor TFT, a first capacitor C1', and a second capacitor C2'. The first circuit EC may be connected to the driving voltage line VDL and the data line DL.

The thin-film transistor TFT may include the semiconductor layer Act and the gate electrode G.

According to one or more embodiments, the first low-resistance area A1 of the semiconductor layer Act may be connected to the data line DL through the fourth contact hole CT4. The second low-resistance area A2 may be connected to the driving voltage line VDL through the fifth contact hole CT5. The data line DL may entirely overlap the fourth contact hole CT4 in a plan view. Also, the driving voltage line VDL may entirely overlap the fifth contact hole CT5 in the plan view.

The first capacitor C1' may include a first lower electrode B1 and the first upper electrode 201 overlapping the first lower electrode B1, and the second capacitor C2' may include a second lower electrode B2 and the second upper electrode 202 overlapping the second lower electrode B2.

In the plan view, the first capacitor C1' and the second capacitor C2' may not overlap the thin-film transistor TFT and may be arranged in a different location from the thin-film transistor TFT. The first lower electrode B1 and the second lower electrode B2 may be arranged on (or at) the same layer as the semiconductor layer Act and may be arranged to be apart (or separated) from the semiconductor layer Act. The first lower electrode B1 and the second lower electrode B2 may be conductive, like the first low-resistance area A1 and the second low-resistance area A2.

Figure 11:
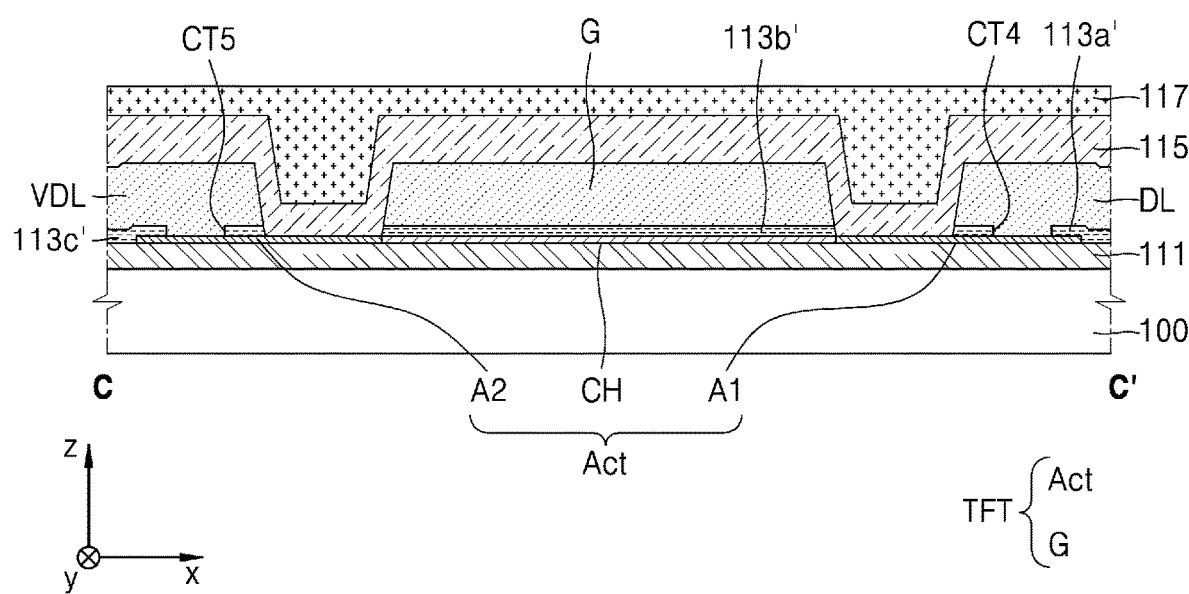
FIG. 11 is a schematic cross-sectional view of the display apparatus, taken along line C-C' of FIG. 10, according to one or more embodiments of the present disclosure.

FIG. 11 is a schematic cross-sectional view of the display apparatus taken along the line C-C' of FIG. 10, according to one or more embodiments of the present disclosure.

Referring to FIG. 11, the first circuit EC may include the thin-film transistor TFT arranged on (or at) the substrate 100. The thin-film transistor TFT may include the semiconductor layer Act and the gate electrode G at least partially overlapping the semiconductor layer Act.

The buffer layer 111 may be arranged on (or at) the substrate 100. The semiconductor layer Act may be arranged on (or at) the buffer layer 111. The semiconductor layer Act may include an oxide semiconductor. The gate insulating layer 113 may be arranged on (or at) the semiconductor layer Act.

The semiconductor layer Act may include the channel area CH and the first low-resistance area A1 and the second low-resistance area A2 that are conductive and arranged at both sides of the channel area CH, respectively. In one or more embodiments, a plurality of opening portions may be formed in the first low-resistance area A1 and the second low-resistance area A2. The plurality of opening portions may be arranged at both sides of the channel area CH, respectively. One of the plurality of opening portions may be between the channel area CH and the data line DL, and the other may be between the channel area CH and the driving voltage line VDL.

The gate insulating layer 113 may include the fourth contact hole CT4 overlapping the first low-resistance area A1 of the semiconductor layer Act. Also, the gate insulating layer 113 may include the fifth contact hole CT5 overlapping the second low-resistance area A2.

The gate insulating layer 113 may be patterned. As illustrated in FIG. 11, the gate insulating layer 113 may include a first insulating pattern 113a', a second insulating pattern 113b', and a third insulating pattern 113c' that are apart (or separated) from each other. The second insulating pattern 113b' may overlap the channel area CH, the first insulating pattern 113a' may overlap a portion of the first low-resistance area A1, and the third insulating pattern 113c' may overlap a portion of the second low-resistance area A2. Both the first insulating pattern 113a' and the third insulating pattern 113c' may cover an end of the semiconductor layer Act, respectively. According to one or more embodiments, the plurality of patterns may not be patterned in the gate insulating layer 113, and the gate insulating layer 113 may extend continuously. For example, the gate insulating layer 113 may continually extend between the fourth contact hole CT4 and the fifth contact hole CT5.

The driving voltage line VDL, the data line DL, and the gate electrode G may be arranged on (or at) the gate insulating layer 113. The data line DL may be electrically connected to the first low-resistance area A1 through the fourth contact hole CT4 of the gate insulating layer 113. The driving voltage line VDL may be electrically connected to the second low-resistance area A2 through the fifth contact hole CT5 of the gate insulating layer 113.

The interlayer insulating layer 115 may be arranged to cover the driving voltage line VDL, the data line DL, and the gate electrode G. The planarization layer 117 may be arranged on (or at) the interlayer insulating layer 115.

Figure 12A:
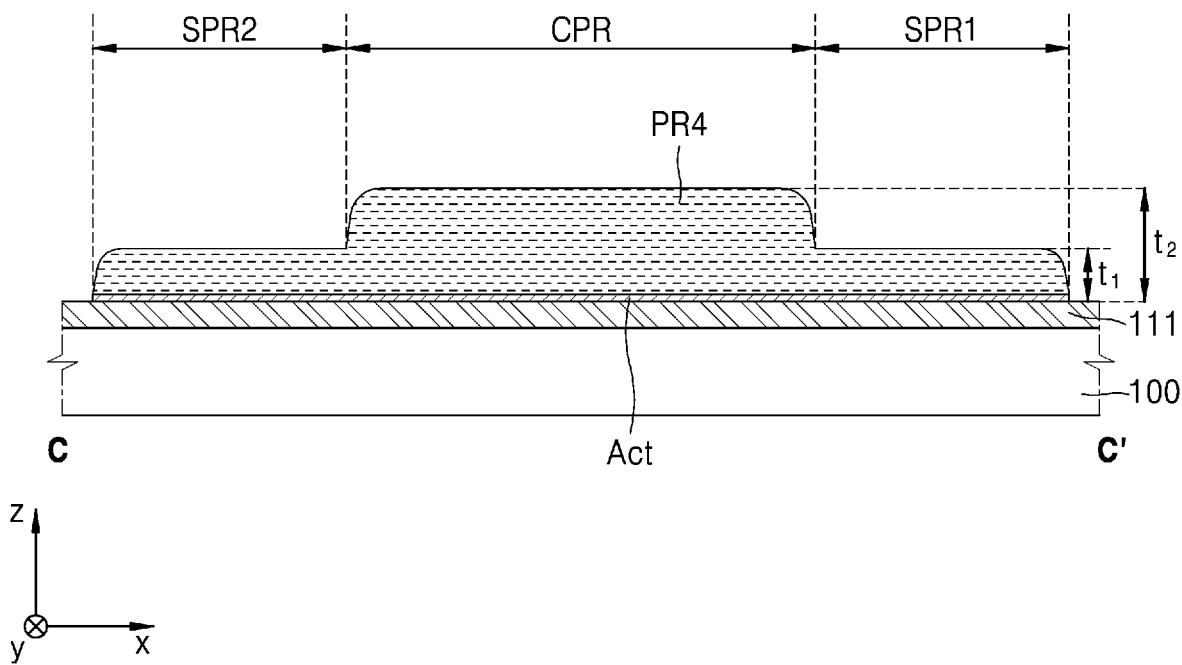
FIGS. 12A through 12C are cross-sectional views for sequentially describing a method of manufacturing the display apparatus, taken along line C-C' of FIG. 10, according to one or more embodiments of the present disclosure.
Figure 12B:
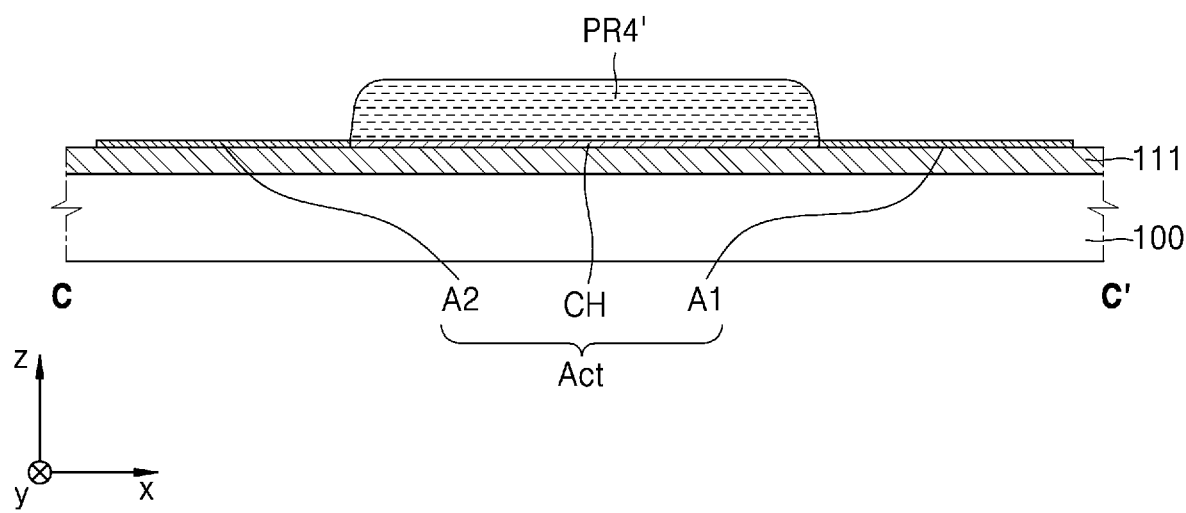
Figure 12C:
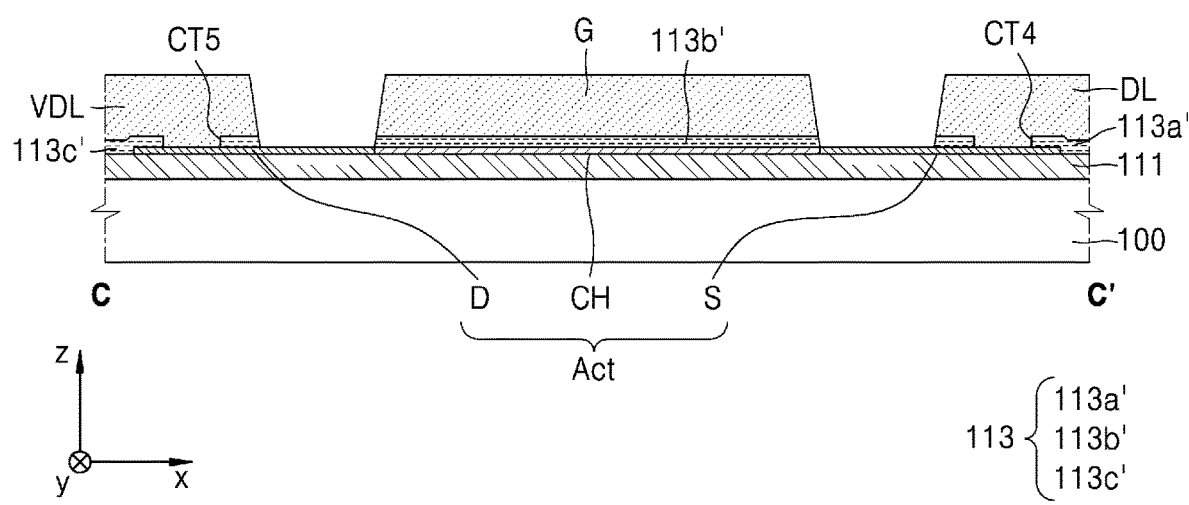

FIGS. 12A, 12B, and 12C are cross-sectional views taken along the line C-C' of FIG. 10 for sequentially describing a method of manufacturing the display apparatus, according to one or more embodiments of the present disclosure.

Referring to FIG. 12A, a preliminary semiconductor layer may be formed on (or at) the buffer layer 111. A fourth photoresist PR4 may be formed on (or at) the preliminary semiconductor layer. The fourth photoresist PR4 may be formed by applying a photoresist layer and performing an exposure and development process thereon. When exposing the photoresist layer, a half tone mask or a slit mask may be used.

The fourth photoresist PR4 may overlap a portion of the preliminary semiconductor layer, the portion corresponding to the semiconductor layer Act. The fourth photoresist PR4 may include a channel photoresist region CPR and a first side photoresist region SPR1 and a second side photoresist region SPR2 at both sides of the channel photoresist region CPR, respectively. The channel photoresist region CPR may overlap a portion of the preliminary semiconductor layer, the portion corresponding to the channel area CH of the semiconductor layer Act. The first side photoresist region SPR1 may overlap a first area corresponding to the first low-resistance area A1 of the semiconductor layer Act. The second side photoresist region SPR2 may overlap a second area corresponding to the second low-resistance area A2 of the semiconductor layer Act. Here, an area including the first area and the second area may denote the entire area of the semiconductor layer Act except for the channel area CH. The second side photoresist region SPR2 may be substantially the same as the first side photoresist region SPR1, and thus, the first side photoresist region SPR1 is mainly described in detail.

The first side photoresist region SPR1 may have a first thickness t1, and the channel photoresist region CPR may have a second thickness t2. The first thickness t1 may be a maximum distance from a bottom surface of the fourth photoresist PR4 to a top surface of the fourth photoresist PR4, the top surface of the fourth photoresist PR4 being opposite to the bottom surface of the fourth photoresist PR4, in the first side photoresist region SPR1. The second thickness t2 may be a maximum distance from the bottom surface of the fourth photoresist PR4 to the top surface of the fourth photoresist PR4, in the channel photoresist region CPR. The second thickness t2 may be greater than the first thickness t1.

The preliminary semiconductor layer may be etched. According to one or more embodiments, etching may be wet etching. The preliminary semiconductor layer overlapping the fourth photoresist PR4 may not be etched and may become the semiconductor layer Act. In one or more embodiments, the preliminary semiconductor layer may be over-etched. In one or more embodiments, the preliminary semiconductor layer overlapping an edge of the fourth photoresist PR4 may be at least partially eliminated.

Referring to FIG. 12B, the fourth photoresist PR4 may be etched. According to one or more embodiments, the etching may be dry etching. For example, the fourth photoresist PR4 may be ashed (e.g., plasma ashed). The thickness of the fourth photoresist PR4 may be reduced by etching. The first and second side photoresist regions SPR1 and SPR2 may have a less thickness than the channel photoresist region CPR of the fourth photoresist PR4 illustrated in FIG. 12A, and thus, the first and second side photoresist regions SPR1 and SPR2 may be eliminated. In other words, only the channel photoresist region CPR of the fourth photoresist PR4 illustrated in FIG. 12A may remain, as illustrated in FIG. 12B. The etched fourth photoresist PR4 is called a changed fourth photoresist PR4'.

When etching the fourth photoresist PR4, portions of the semiconductor layer Act, the portions corresponding to the eliminated first and second side photoresist regions SPR1 and SPR2, may be exposed. When the fourth photoresist PR4 is etched, the exposed semiconductor layer Act may be made conductive due to addition of impurities, etc., and the semiconductor layer Act may include the first low-resistance area A1 and the second low-resistance area A2 that are made conductive. The first low-resistance area A1 and the second low-resistance area A2 may have a lower resistance than the channel area CH.

As described above, both of the first low-resistance area A1 and the second low-resistance area A2 may be doped when the semiconductor layer Act is formed, and thus, the first and second low-resistance areas A1 and A2 may become conductive regardless of subsequent processes and may have low resistance. Thereafter, the changed fourth photoresist PR4' may be stripped.

Referring to FIG. 12C, the gate insulating layer 113 may be formed on (or at) the semiconductor layer Act. The gate insulating layer 113 may be formed to cover an end of the semiconductor layer Act. The fourth contact hole CT4 and the fifth contact hole CT5 may be formed in the gate insulating layer 113. A portion of the first low-resistance area A1, the portion overlapping the fourth contact hole CT4, and a portion of the second low-resistance area A2, the portion overlapping the fifth contact hole CT5, may be additionally doped, when the fourth contact hole CT4 and the fifth contact hole CT5 are formed.

The driving voltage line VDL, the data line DL, and the gate electrode G may be formed on (or at) the gate insulating layer 113. As described, for example, with reference to FIG. 8C, the driving voltage line VDL, the data line DL, and the gate electrode G may be formed by forming a preliminary electrode layer and patterning the preliminary electrode layer by using a photoresist pattern thereon.

While the photoresist pattern for forming the driving voltage line VDL, the data line DL, and the gate electrode G is not eliminated, a portion of the gate insulating layer 113 may be etched and patterned to form the first insulating pattern 113a', the second insulating pattern 113b', and the third insulating pattern 113c'. The first insulating pattern 113a' may overlap the data line DL, the second insulating pattern 113b' may overlap the gate electrode G, and the third insulating pattern 113c' may overlap the driving voltage line VDL. The first insulating pattern 113a', the second insulating pattern 113b', and the third insulating pattern 113c' may be spatially/physically separated from one another.

However, according to one or more embodiments, a process of separating the gate insulating layer 113 into a plurality of patterns may be omitted. In other words, the process of etching the gate insulating layer 113 while the photoresist pattern is not eliminated may be omitted. The process of separating the gate insulating layer 113 into a plurality of patterns may be a subsequent process in which the gate insulating layer 113 is at least partially eliminated to make the first area and the second area conductive as the first low-resistance area A1 and the second low-resistance area A2. According to the present embodiment, both of the first area and the second area may be doped when the semiconductor layer Act is formed, and thus, the process of separating the gate insulating layer 113 into a plurality of patterns may be omitted. Thus, the semiconductor layer Act may not be exposed, except for the areas thereof overlapping the fourth contact hole CNT4 and the fifth contact hole CNT5.

Thereafter, the photoresist pattern may be stripped. Next, the interlayer insulating layer 115 and the planarization layer 117 may be sequentially formed (see, e.g., FIG. 7).

Figure 13:
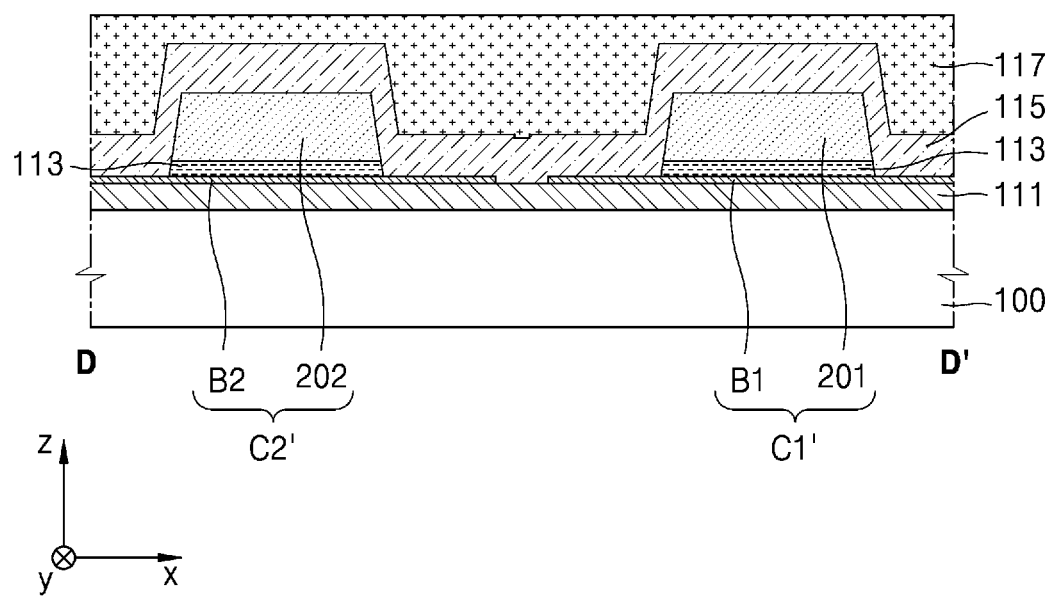
FIG. 13 is a schematic cross-sectional view of the display apparatus, taken along the line D-D' of FIG. 10, according to one or more embodiments of the present disclosure.

FIG. 13 is a schematic cross-sectional view of the display apparatus, taken along the line D-D' of FIG. 10, according to one or more embodiments of the present disclosure.

Referring to FIG. 13, the first circuit EC may include a first capacitor C1' and a second capacitor C2' arranged on (or at) the substrate 100. The first capacitor C1' may include the first lower electrode B1 and the first upper electrode 201, and the second capacitor C2' may include the second lower electrode B2 and the second upper electrode 202.

The buffer layer 111 may be arranged on (or at) the substrate 100. The first and second lower electrodes B1 and B2 may be arranged on (or at) the buffer layer 111. The first and second lower electrodes B1 and B2 may be arranged on (or at) the same layer as the semiconductor layer Act. The first and second lower electrodes B1 and B2 may have a higher carrier concentration than the channel area CH of the semiconductor layer Act. The first and second lower electrodes B1 and B2 may have a lower resistance than the channel area CH, like the first and second low-resistance areas A1 and A2, and thus, may be formed by a process of doping impurities or a conductive process.

The gate insulating layer 113 may be arranged on (or at) the first and second lower electrodes B1 and B2, which are arranged to be apart (or separated) from each other. The gate insulating layer 113 may be patterned. However, the present disclosure is not limited thereto. According to one or more embodiments, the gate insulating layer 113 may extend to entirely cover the first and second lower electrodes B1 and B2.

The first upper electrode 201 of the first capacitor C1' and the second upper electrode 202 of the second capacitor C2' may be arranged on (or at) the gate insulating layer 113. The first upper electrode 201 and the second upper electrode 202 may overlap the first lower electrode B1 and the second lower electrode B2, respectively, with the gate insulating layer 113 therebetween. The first and second upper electrodes 201 and 202 may be arranged on (or at) the same layer and may include the same material as the gate electrode G.

The interlayer insulating layer 115 may be arranged to cover the first and second upper electrodes 201 and 202. The planarization layer 117 may be arranged on (or at) the interlayer insulating layer 115.

Figure 14A:
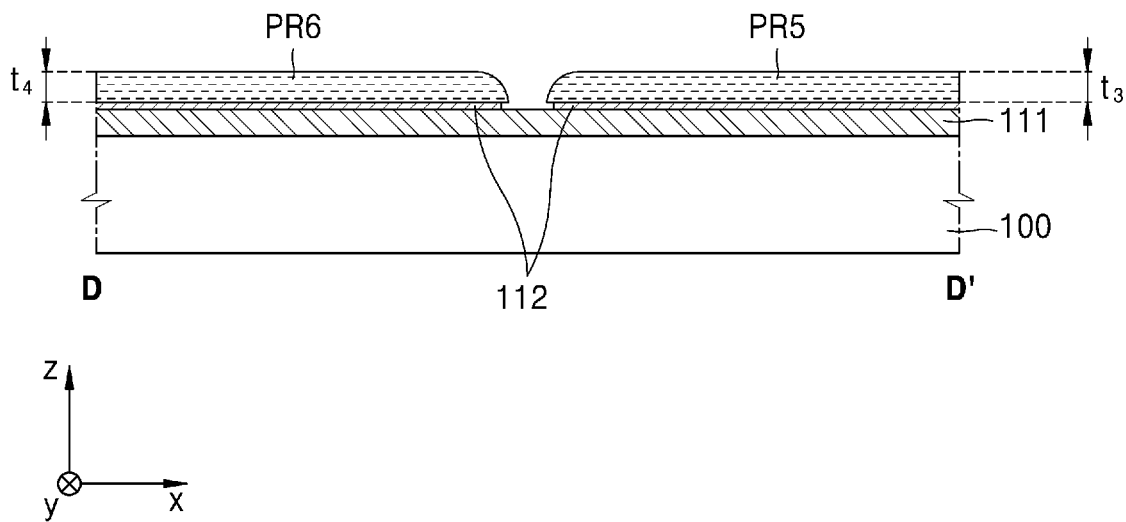
FIGS. 14A through 14C are cross-sectional views for sequentially describing a method of manufacturing a display apparatus, taken along line D-D' of FIG. 10, according to one or more embodiments of the present disclosure.
Figure 14B:
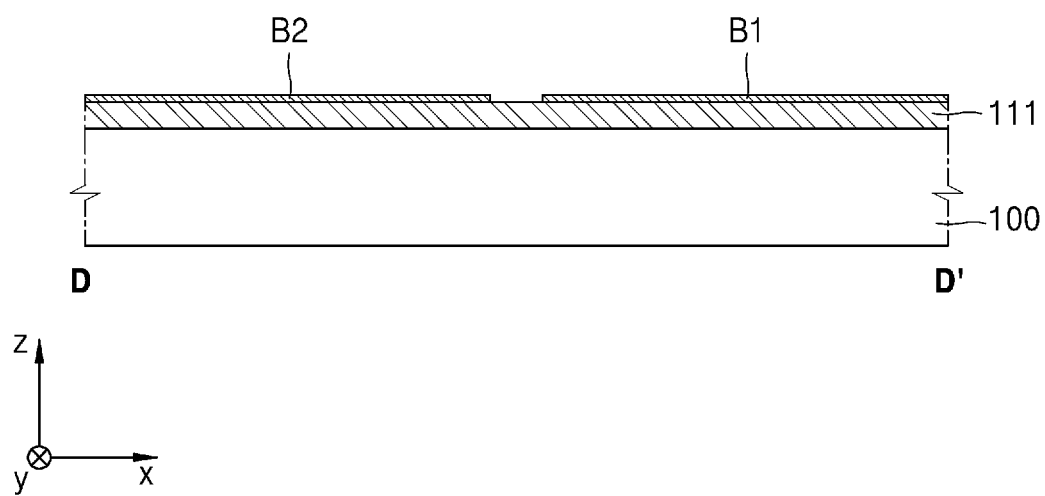
Figure 14C:
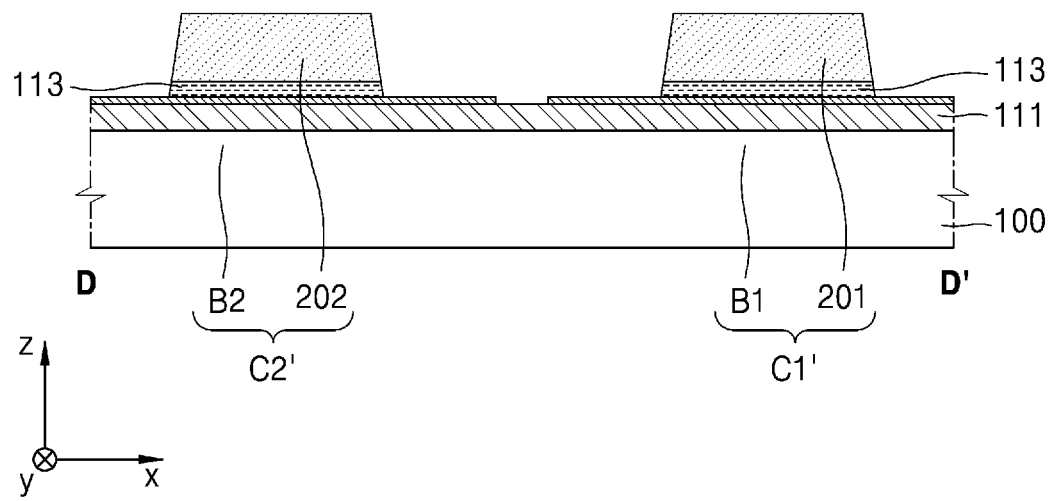

FIGS. 14A, 14B, and 14C are cross-sectional views taken along the line D-D' of FIG. 10 for sequentially describing a method of manufacturing the display apparatus according to one or more embodiments of the present disclosure.

Referring to FIG. 14A, a first layer 112 may be formed on (or at) the buffer layer 111. The first layer 112 may include the same material as the preliminary semiconductor layer described with reference to FIG. 12A and they may be formed simultaneously as one layer. A fifth photoresist PR5 and a sixth photoresist PR6 may be formed on (or at) the first layer 112. The fifth and sixth photoresists PR5 and PR6 may be formed by applying a photoresist layer and performing an exposure and development process thereon. When exposing the photoresist layer, a half tone mask or a slit mask may be used.

The fifth and sixth photoresists PR5 and PR6 may overlap portions of the first layer 112, the portions corresponding to the first lower electrode B1 and the second lower electrode B2, respectively. The fifth and sixth photoresists PR5 and PR6 may have a third thickness t4 and a fourth thickness t4, respectively. The third thickness t3 may be a maximum distance from a bottom surface of the fifth photoresist PR5 to a top surface of the fifth photoresist PR5. The fourth thickness t4 may be a maximum distance from a bottom surface of the sixth photoresist PR6 to a top surface of the sixth photoresist PR6. The third and fourth thicknesses t3 and t4 may be less than the second thickness t2 of the fourth photoresist PR4 described with reference to FIG. 12A.

The first layer 112 may be etched. Etching may be wet etching. The first layer 112 not overlapping the fifth and sixth photoresists PR5 and PR6 may be eliminated.

Referring to FIG. 14B, the fifth and sixth photoresists PR5 and PR6 may be etched. Etching may be dry etching. For example, the fifth and sixth photoresists PR5 and PR6 may be ashed (e.g., plasma ashed). The fifth and sixth photoresists PR5 and PR6 may be eliminated by etching.

When the fifth and sixth photoresists PR5 and PR6 are eliminated, portions of the first layer 112, the portions overlapping the fifth and sixth photoresists PR5 and PR6, may be made conductive due to addition of impurities, etc. The portion of the first layer 112, the portion overlapping the fifth photoresist PR5, may become the first lower electrode B1, and the portion of the first layer 112, the portion overlapping the sixth photoresist PR6, may become the second lower electrode B2. The first lower electrode B1 and the second lower electrode B2 may be made conductive and may have low resistance.

Referring to FIG. 14C, the gate insulating layer 113 may be formed on (or at) the first and second lower electrodes B1 and B2. The first and second upper electrodes 201 and 202 may be formed on (or at) the gate insulating layer 113. The first and second upper electrodes 201 and 202 may be formed by the same method as the gate electrode G described with reference to FIG. 8C or FIG. 12C.

The interlayer insulating layer 115 may be arranged to cover the first and second upper electrodes 201 and 202, as shown, for example, in FIG. 13. The planarization layer 117 may be arranged on (or at) the interlayer insulating layer 115.

Figure 15:
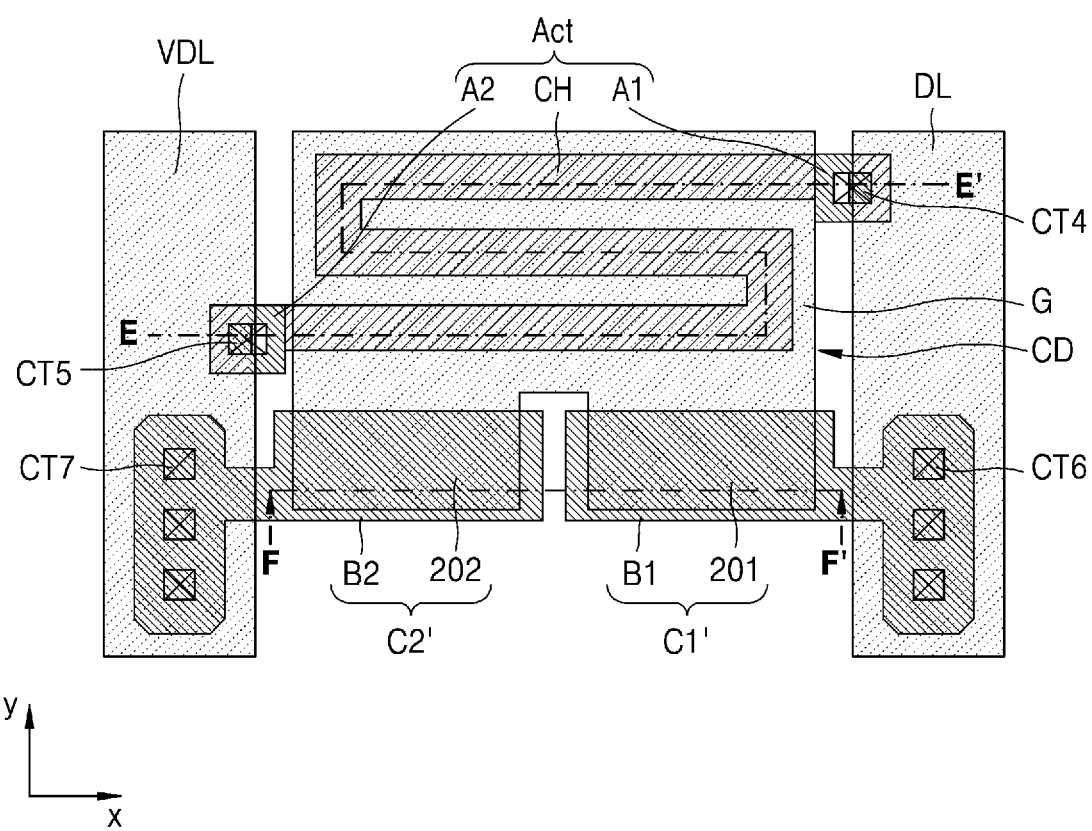
FIG. 15 is an enlarged view of region X of FIG. 6A, according to one or more embodiments of the present disclosure.

FIG. 15 is an enlarged view of region X of FIG. 6A, according to one or more embodiments of the present disclosure. FIG. 15 illustrates a modified example of FIG. 10. Hereinafter, aspects different from FIG. 10 are mainly described.

Referring to FIG. 15, the first low-resistance area A1 of the semiconductor layer Act may be connected to the data line DL through the fourth contact hole CT4. The second low-resistance area A2 of the semiconductor layer Act may be connected to the driving voltage line VDL through the fifth contact hole CT5.

The data line DL may not entirely overlap the fourth contact hole CT4 in a plan view. That is, in the plan view, the data line DL may overlap a portion of the fourth contact hole CT4. Similarly, the driving voltage line VDL may not entirely overlap the fifth contact hole CT5 in the plan view. That is, in the plan view, the driving voltage line VDL may overlap a portion of the fifth contact hole CT5. A connection structure between the data line DL and the driving voltage line VDL and the semiconductor layer Act through the contact hole may be the same as described above with reference to FIG. 6C.

A cross-section of FIG. 15, taken along the line E-E', may have the same structure as FIG. 7. Also, a cross-section of FIG. 15, taken along the line F-F', may have the same structure as FIG. 13.

The display apparatus according to one or more of the above embodiments of the present disclosure may have a simple stack structure and may block the introduction of static electricity to prevent (or substantially prevent) defects of the display apparatus in advance. However, the scope of the present disclosure is not limited to the effect as described above.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims and their respective equivalents.

What is claimed is:

1. A display apparatus comprising:
   a substrate comprising a display area and a non-display area outside the display area;
   a data line in the display area and extending in a first direction;
   a voltage line in the display area and extending in the first direction; and
   a first circuit disposed in the non-display area and electrically connected to the data line and the voltage line, wherein the first circuit comprises:
      a thin-film transistor comprising a semiconductor layer and a gate electrode overlapping the semiconductor layer, wherein the semiconductor layer is in the non-display area, and one side of the semiconductor layer is electrically connected to the data line and another side of the semiconductor layer is electrically connected to the voltage line;
      a first capacitor electrically connected to the data line and the gate electrode and comprising a first lower electrode not overlapping the semiconductor layer and a first upper electrode on the first lower electrode; and
      a second capacitor electrically connected to the voltage line and the gate electrode and comprising a second lower electrode not overlapping the semiconductor layer and a second upper electrode on the second lower electrode, and
      wherein the gate electrode is at a same layer as the data line and the voltage line.

2. The display apparatus of claim 1, wherein each of the first upper electrode and the second upper electrode is integrated with the gate electrode.

3. The display apparatus of claim 1, wherein the voltage line comprises a driving voltage line.

4. The display apparatus of claim 1, wherein the semiconductor layer comprises a channel area overlapping the gate electrode, a first low-resistance area, and a second low-resistance area, wherein the first low-resistance area is at one side of the channel area and the second low-resistance area is at another side of the channel area.

5. The display apparatus of claim 4, wherein each of the first lower electrode and the second lower electrode is at a same layer as the semiconductor layer.

6. The display apparatus of claim 5, wherein each of the first lower electrode and the second lower electrode has a higher carrier concentration than the channel area.

7. The display apparatus of claim 4, wherein the first capacitor and the second capacitor are configured to allow current to flow through the channel area when alternating static electricity occurs in the data line.

8. The display apparatus of claim 1, wherein each of the first lower electrode and the second lower electrode is a part of a first conductive pattern arranged between the substrate and the semiconductor layer and insulated from the semiconductor layer.

9. The display apparatus of claim 1, wherein the semiconductor layer comprises an oxide semiconductor material.

10. The display apparatus of claim 1, wherein the semiconductor layer has a curved shape in a plan view.

11. A display apparatus comprising:
    a substrate comprising a display area and a non-display area outside the display area;
    a data line in the display area and extending in a first direction;
    a voltage line in the display area and extending in the first direction; and
    a first circuit disposed in the non-display area and electrically connected to the data line and the voltage line, wherein the first circuit comprises:
       a semiconductor layer located between a portion of the data line and a portion of the voltage line, the portion of the data line and the portion of the voltage line extending to the non-display area, and electrically connected to each of the portion of the data line and the portion of the voltage line;
       a first capacitor comprising a first lower electrode electrically connected to the data line;
       a second capacitor comprising a second lower electrode electrically connected to the voltage line; and
       a conductor overlapping a portion of the semiconductor layer, at least a portion of the first lower electrode, and at least a portion of the second lower electrode.

12. The display apparatus of claim 11, wherein the conductor is at a same layer as the data line and the voltage line.

13. The display apparatus of claim 11, wherein the voltage line comprises a driving voltage line.

14. The display apparatus of claim 11, wherein the semiconductor layer comprises a channel area overlapping the conductor and a first low-resistance area and a second low-resistance area at both sides of the channel area, respectively.

15. The display apparatus of claim 14, wherein each of the first lower electrode and the second lower electrode is at a same layer as the semiconductor layer.

16. The display apparatus of claim 15, wherein each of the first lower electrode and the second lower electrode has a higher carrier concentration than the channel area.

17. The display apparatus of claim 14, wherein the first capacitor and the second capacitor are configured to allow current to flow through the channel area when alternating static electricity occurs in the data line.

18. The display apparatus of claim 11, wherein each of the first lower electrode and the second lower electrode is a part of a first conductive pattern arranged between the substrate and the semiconductor layer and insulated from the semiconductor layer.

19. The display apparatus of claim 11, wherein the semiconductor layer comprises an oxide semiconductor material.

20. The display apparatus of claim 11, wherein the semiconductor layer has a curved shape in a plan view.

* * * * *